(12) United States Patent
Onai et al.

(10) Patent No.: US 8,822,593 B2
(45) Date of Patent: Sep. 2, 2014

(54) CURABLE RESIN COMPOSITION, HARDENED MATERIAL THEREOF, AND OPTICAL SEMICONDUCTOR APPARATUS

(71) Applicant: Shin-Etsu Chemical Co., Ltd., Tokyo (JP)

(72) Inventors: Satoshi Onai, Takasaki (JP); Eiichi Tabei, Annaka (JP); Masayuki Ikeno, Maebashi (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/914,733

(22) Filed: Jun. 11, 2013

(65) Prior Publication Data

US 2013/0345359 A1    Dec. 26, 2013

(30) Foreign Application Priority Data

Jun. 22, 2012 (JP) ................... 2012-140448
Aug. 3, 2012 (JP) ................... 2012-172513

(51) Int. Cl.
*C08L 83/04* (2006.01)
*B22F 1/00* (2006.01)
*C08G 77/14* (2006.01)
*C08G 77/16* (2006.01)
*C08G 77/12* (2006.01)
*C09D 183/04* (2006.01)

(52) U.S. Cl.
CPC ............... *C08L 83/04* (2013.01); *C08G 77/14* (2013.01); *C08G 77/16* (2013.01); *C08G 77/12* (2013.01); *C09D 183/04* (2013.01); *H01L 2933/0058* (2013.01); *H01L 2933/0083* (2013.01)
USPC .............................. 524/588; 524/1

(58) Field of Classification Search
CPC ........ C08L 83/04; C08G 77/14; C08G 77/16; C08G 77/12; C09D 183/04; H01L 2933/0058; H01L 2933/0083

USPC ........................................... 524/588, 1
See application file for complete search history.

(56) References Cited

U.S. PATENT DOCUMENTS

| | | | |
|---|---|---|---|
| 4,528,390 A | 7/1985 | Kimura | |
| 5,538,793 A | 7/1996 | Inokuchi et al. | |
| 2004/0094757 A1 | 5/2004 | Braune et al. | |
| 2008/0008867 A1* | 1/2008 | Shimizu et al. | 428/220 |
| 2011/0098420 A1* | 4/2011 | Takizawa et al. | 525/477 |

FOREIGN PATENT DOCUMENTS

| | | |
|---|---|---|
| JP | 40-16917 | 8/1965 |
| JP | A-54-72300 | 6/1979 |
| JP | A-60-13813 | 1/1985 |
| JP | A-3-244636 | 10/1991 |
| JP | A-4-88023 | 3/1992 |
| JP | A-7-196815 | 8/1995 |
| JP | A-2005-524737 | 8/2005 |
| JP | B2-4591690 | 12/2010 |
| JP | 2011-252070 | * 12/2011 |

OTHER PUBLICATIONS

Maeda et al, JP 2011-252070 English Translation.*

* cited by examiner

*Primary Examiner* — Ling Choi
*Assistant Examiner* — Jessica E Whiteley
(74) *Attorney, Agent, or Firm* — Oliff PLC

(57) ABSTRACT

A curable resin composition to which at least phosphor particles and nanoparticles having a primary particle size of 1 nm or more and less than 100 nm are added, wherein the nanoparticles are dispersed in the form of secondarily aggregated particles having an average particle size of 100 nm or more and 20 μm or less in terms of volume Q3 is provided for an optical semiconductor apparatus in which when a sealant obtained by dispersing phosphor particles in a curable resin composition having a low viscosity is filled into a package substrate, the dispersion state of the phosphor particles is not changed at the early and late stages of the fabrication, specifically the amounts of the phosphor particles to be contained at the early and late stages are the same, and the color rendering property can be stably maintained, a hardened material thereof, and an optical semiconductor apparatus.

20 Claims, 1 Drawing Sheet

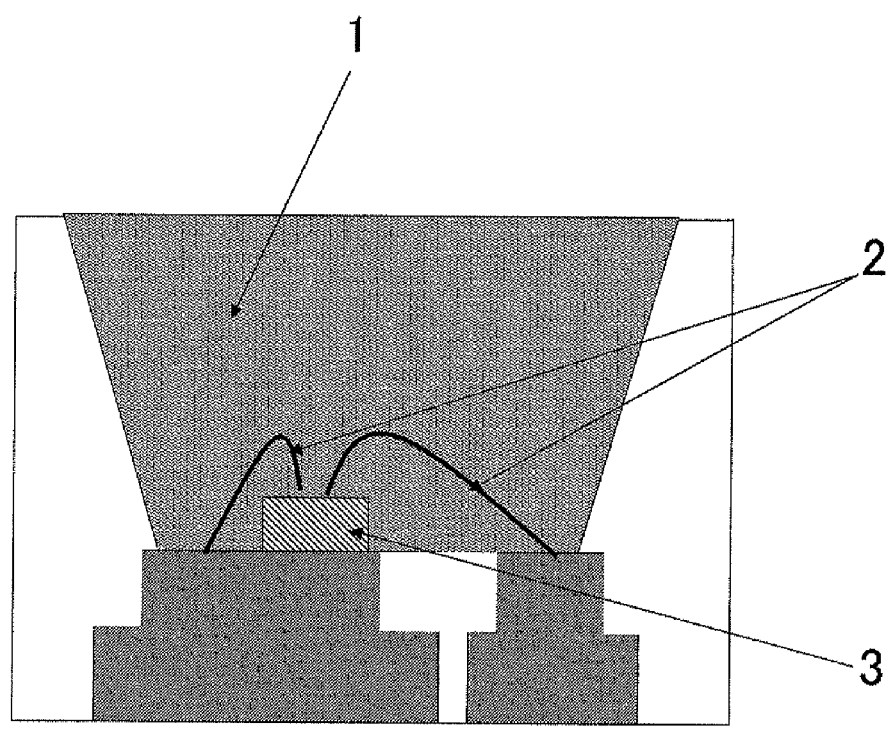

CURABLE RESIN COMPOSITION, HARDENED MATERIAL THEREOF, AND OPTICAL SEMICONDUCTOR APPARATUS

BACKGROUND OF THE INVENTION

1. Field of the Invention

The present invention relates to a curable resin composition useful as a material for an optical apparatus/an optical component, an insulator material for an electronic apparatus/an electronic component, and a coating material, a hardened material thereof, and an optical semiconductor apparatus.

2. Description of the Related Art

An optical semiconductor apparatus typified by a light-emitting diode (LED) is generally characterized by low power consumption and long life span. For this reason, the optical semiconductor apparatus is widely used for applications such as a backlight for a portable telephone, a backlight for a liquid crystal television, a lighting for an automobile, a lighting equipment, and a signboard.

In particular, since an LED apparatus is widely used for an application of an outdoor lighting and an application for an automobile, a resin composition used as a LED device sealing material, an electronic apparatus insulator material, or a coating material is required to have high durability. Therefore, the resin composition is required to have a performance in which a crack is unlikely to occur under a severe temperature cycle, resistance to discoloration by long-time exposure to high temperature is excellent, and transmission of gas such as $SO_x$ can be prevented.

In general, the luminescence characteristics of an optical semiconductor apparatus are determined by a combination of a light-wavelength transforming material (hereinafter referred to as phosphor) with an optical semiconductor device. An optical semiconductor apparatus having color rendering properties for various intended purposes depending on the weight ratio of the phosphor to be mixed can be obtained. However, it is difficult that a light-emitting apparatus having stable color rendering properties is consecutively fabricated in the fabrication of such an optical semiconductor apparatus. Specifically, a predetermined amount of sealant in which a phosphor is added to a curable resin composition having a high transparency is filled into a package substrate having an optical semiconductor device mounted thereon and a concave portion subjected to wire bonding using a dispensing apparatus, and is hardened to fabricate an optical semiconductor apparatus. In this process, since the specific gravity of the added phosphor is larger than that of the curable resin composition, the sealant is precipitated at the bottom of a container due to the weight of the phosphor itself over time. This is because the general phosphor is a material having a density of about 4 to 6 $g/cm^3$ and an average particle size of 20 μm or less and the curable resin composition has a density of about 1 $g/cm^3$. Therefore, the precipitation of phosphor over time during the sealing process of the fabrication process can be easily understood. Accordingly, when a sealant containing a phosphor is filled into a package substrate, the deviation state of the phosphor is changed at the early and late stages of the fabrication, and there is a phenomenon in which the content of the phosphor in the sealant is large at the early stage, and the content of the phosphor in the sealant is small at the late stage. This is because an increase or a decrease in the content of the phosphor is involved in the amount of light to be transformed. Thus, the color rendering properties designed are changed, and therefore there is a problem in which a product having stable characteristics cannot be obtained.

In Patent document 1 as an example of solving the problem, silicone rubber spherical fine particles having an average particle size of 0.1 to 100 μm are added to a thermosetting resin composition. However, the process has a problem in which the silicone rubber spherical fine particles and a surface treatment agent have low heat resistance and light resistance in many cases. Further, Patent document 2 has proposed a process for dispersing nanoparticles having an average particle size of 1 nm or more and 25 nm or less at a nano scale to prevent the precipitation of a phosphor.

The proposed processes achieve an effect of preventing the precipitation of a phosphor in a curable resin composition having a comparatively high viscosity, but cannot achieve the effect in the curable resin composition having a low viscosity. Thus, the color rendering properties designed are changed, and therefore a problem in which a product having stable characteristics cannot be obtained is not solved.

Accordingly, a curable resin composition for an optical semiconductor apparatus is required in which when a sealant obtained by dispersing a phosphor in a curable resin composition having a low viscosity is filled into a package substrate, the deviation state of the phosphor is not changed at the early and late stages of the fabrication, the amounts of the phosphor to be contained at the early and late stages are the same, and the color rendering property can be stably maintained.

PRIOR ART DOCUMENTS

Patent Documents

Patent document 1: Japanese Patent No. 4591690
Patent document 2: Japanese Patent Application Publication No. 2005-524737

SUMMARY OF THE INVENTION

The present invention is made in view of the above-described problems. An object of the present invention is to provide a curable resin composition in which when a sealant obtained by dispersing phosphor particles in a curable resin composition having a low viscosity is filled into a package substrate, the deviation state of the phosphor particles is not changed at the early and late stages of the fabrication, specifically the amounts of the phosphor particles to be contained at the early and late stages are the same, and the color rendering property can be stably maintained, a hardened material thereof, and an optical semiconductor apparatus.

Another object of the present invention is to provide a curable resin composition which has a high resistance to repetitive thermal shock to hardly cause a crack even under a severe temperature cycle, and excellent resistance to discoloration, and can prevent transmission of gas such as $SO_x$, and stably maintain the color rendering property, a hardened material thereof, and an optical semiconductor apparatus.

In order to solve the above-described problems, the present invention provides a curable resin composition to which at least phosphor particles and nanoparticles having a primary particle size of 1 nm or more and less than 100 nm are added, wherein the nanoparticles are dispersed in the form of secondarily aggregated particles having an average particle size of 100 nm or more and 20 μm or less in terms of volume Q3.

Such a curable resin composition is in such a state that nanoparticles are secondarily aggregated in the curable resin composition, and therefore can effectively inhibit a force of movement of phosphor particles due to the gravity and prevent the precipitation. Therefore, even when the dispensing process takes a long time, the amounts of the phosphor particles in an LED apparatus at the early and late stages of the dispensing process can be approximately the same. Further, the handleability of the sealant can be enhanced.

Further, a curable resin composition in which a silicone powder having an average particle size of 0.5 to 100 μm is dispersed in the curable resin composition described above is provided.

Such a curable resin composition has a high resistance to repetitive thermal shock to hardly cause a crack even under a severe temperature cycle, and excellent resistance to discoloration, and can prevent transmission of gas such as $SO_x$.

It is preferable that the curable resin composition contain at least one of a silicone resin, a modified silicone resin, an epoxy resin, and a modified epoxy resin, and have a viscosity at room temperature of 100 mPa·s or more and 10,000 mPa·s or less.

In such a curable resin composition, an effect of preventing the precipitation of phosphor particles can be further obtained.

It is preferable that the curable resin composition contain a silicone resin or a modified silicone resin.

Such a curable resin composition is useful as an optical coating material such as sealing materials for a light-emitting diode or an LED device.

Further, the curable resin composition is preferably a curable silicone composition containing:
(A) a compound having a structure represented by the following general formula (1):

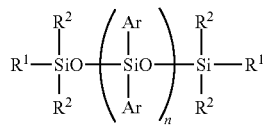

wherein, $R^1$ represents an aliphatic unsaturated group, $R^2$ represents the same or different unsubstituted or substituted monovalent hydrocarbon group, Ar represents an aryl group optionally having the same or different heteroatom, and "n" is an integer of 1 or more,
(B) a compound having a structure represented by the following average composition formula (2), $$R^3_a H_b SiO_{(4-a-b)/2} \quad (2)$$

wherein, $R^3$ represents the same or different unsubstituted or substituted monovalent hydrocarbon group bonded to a silicon atom, provided that an aliphatic unsaturated group is not included, and "a" and "b" are a positive number satisfying $0.7 \leq a \leq 2.1$, $0.001 \leq b \leq 1.0$, and $0.8 \leq a+b \leq 3.0$, and (C) a hydrosilylation catalyst containing a platinum group metal.

Since R in the general formula (1) of the (A) component has an aliphatic unsaturated group, the composition of the present invention can be stably maintained in an unhardened state until an addition reaction is initiated, and the composition can be easily hardened after initiation of the addition reaction. Further, the (B) component is subjected to a hydrosilylation addition reaction with the (A) component and can act as a crosslinking agent. By the presence of the (C) component, the hydrosilylation addition reaction of the (B) component with the (A) component can be promoted.

It is preferable that the (A) component in the curable silicone composition contain a compound having a structure represented by the following general formula (1') and at least two aliphatic unsaturated groups per molecule,

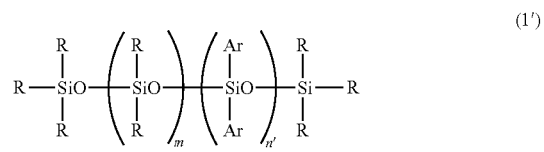

wherein, R represents the same or different unsubstituted or substituted monovalent hydrocarbon group, Ar represents an aryl group optionally having the same or different heteroatom, "m" is an integer of 0 or 1 or more, and "n'" is an integer of 1 or more.

When the (A) component is such a compound, the (B) component is subjected to a hydrosilylation addition reaction with the (A) component and can act as a crosslinking agent.

It is preferable that in the (A) component represented by the general formula (1) or (1'). Ar be a phenyl group and "n" or "n'" be an integer of 1 to 100.

In the general formula (1) or (1') of the (A) component, Ar preferably represents an unsubstituted aromatic hydrocarbon group, particularly preferably a phenyl group. When Ar represents a phenyl group, the refractive index and transparency are excellent and resistance to cracking is more excellent.

Further, the curable resin composition is preferably a curable resin composition containing the following (D) component.

(D) a compound having a structure represented by the following average composition formula (3), $$R^o_c (C_6H_5)_d SiO_{(4-c-d)/2} \quad (3)$$

wherein, $R^o$ represents any of the same or different substituted or unsubstituted monovalent hydrocarbon or an alkoxy group and a hydroxyl group, 0.1 to 80% by mole of all $R^o$ is an alkenyl group, and "c" and "d" are a positive number satisfying and $1 \leq c+d \leq 2$ and $0.20 \leq d/(c+d) \leq 0.95$.

When the (D) component is contained, a preferable hardness of hardened material of a resin composition can be obtained.

It is preferable that the oxygen transmittance of the hardened material obtained by hardening the curable silicone resin composition be 1,000 cm$^3$/m$^2$/24 h/atm or less.

When the oxygen transmittance of the hardened material is equal to or less than the above-described value, the transmission of gas such as sulfur oxide can be effectively suppressed.

It is preferable that the curable resin composition be a curable modified silicone composition containing: (E) a polycyclic hydrocarbon group-containing organosilicon compound which is a product of addition reaction of (X) an organosilicon compound having two hydrogen atoms bonded to a silicon atom per molecule, and (Y) a polycyclic hydrocarbon compound having two hydrosilylation reactive carbon-carbon double bonds per molecule and has two carbon-carbon double bonds bonded to silicon atoms per molecule, (F) any of a siloxane compound having three or more hydrogen atoms bonded to a silicon atom per molecule, an organic modified siloxane compound, and a combination of both, and (C) a hydrosilylation catalyst containing a platinum group metal.

The curable modified silicone composition has transparency, heat resistance, and light resistance, and therefore is useful as an optical coating material such as sealing materials for a light-emitting diode or an LED device.

It is preferable that the (X) component in the (E) component be an organosilicon compound represented by the following general formula (4),

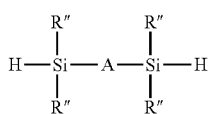

(4)

wherein, A represents a divalent group selected from the group consisting of a group represented by the following general formula (5),

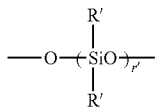

(5)

wherein, R' independently represents an unsubstituted or substituted monovalent hydrocarbon group having 1 to 12 carbon atoms or an alkoxy group having 1 to 6 carbon atoms, and "r'" is an integer of 0 to 100, and a group represented by the following structural formula (6),

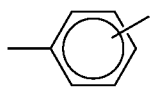

(6)

wherein, R" independently represents an unsubstituted or substituted monovalent hydrocarbon group having 1 to 12 carbon atoms or an alkoxy group having 1 to 6 carbon atoms.

Such a (X) component is particularly useful as a material for the (E) component. When R" and R' are all a methyl group, the (X) component is industrially fabricated with ease and easily available.

The polycyclic hydrocarbon compound of the (Y) component is preferably 5-vinyl bicyclo[2.2.1]hept-2-ene, 6-vinyl bicycl[2.2.1]hept-2-ene, or a combination of both.

By use of the polycyclic hydrocarbon having two addition reactive carbon-carbon double bonds per molecule, an addition reaction by a hydrosilylation reaction is performed.

The (F) component is preferably 1,3,5,7-tetramethyl cyclotetrasiloxane.

SiH of the (F) component is added by a hydrosilylation reaction with at least two addition reactive carbon-carbon double bonds per molecule of the (E) component, to obtain a hardened material having a three-dimensional net structure.

The (F) component is preferably a product of addition reaction of 5-vinyl bicyclo[2.2.1]hept-2-ene, 6-vinyl bicycl[2.2.1]hept-2-ene, or a combination of both with 1,3,5,7-tetramethyl cyclotetrasiloxane.

Such a (F) component is particularly useful in a hydrosilylation reaction with at least two addition reactive carbon-carbon double bonds per molecule of the (E) component.

Further, the present invention provides a hardened material obtained by hardening the curable resin composition.

Even when the curable resin composition of the present invention is a curable resin composition having a low viscosity, the precipitation of phosphor particles can be prevented. The curable resin composition has a high resistance to repetitive thermal shock and resistance to discoloration, and can suppress a transmission amount of gas such as $SO_x$.

Moreover, the present invention provides an optical semiconductor apparatus using the hardened material of the curable resin composition.

When the sealant including the hardened material is filled in a package substrate, the present invention can provide an optical semiconductor apparatus which has excellent resistance to thermal shock and resistance to discoloration and can stably maintain the color rendering property.

Effects of Invention

As described above, the curable resin composition of the present invention is a resin composition forming a hardened material which has a high resistance to repetitive thermal shock to hardly cause a crack even under a severe temperature cycle, and excellent resistance to discoloration during long-time exposure to high temperature, and can prevent the transmission of gas such as $SO_x$. The curable resin composition of the present invention is useful as a curable resin composition which contains the same amount of phosphor particles at the early and late stages, and can stably maintain the color rendering property even when a sealant obtained by dispersing the phosphor particles in a curable resin composition having a low viscosity is filled into a package substrate.

DESCRIPTION OF THE DRAWINGS

FIG. 1 is a schematic cross-sectional view illustrating one example of an optical semiconductor apparatus of the present invention.

DETAILED DESCRIPTION OF THE PREFERRED EMBODIMENTS

The present invention will be described hereinafter in detail.

As described above, a curable resin composition for an optical semiconductor apparatus is required in which the amounts of phosphor particles to be contained at the early and late stages are the same when a sealant obtained by dispersing the phosphor particles in a curable resin composition having excellent resistance to thermal shock, resistance to discoloration, and gas barrier property, and a low viscosity is filled into a package substrate, and the color rendering property can be stably maintained.

The present inventors have intensively investigated to solve the above-described problems, and as a result, found that a curable resin composition to which at least phosphor particles and nanoparticles having a primary particle size of 1 nm or more and less than 100 nm are added, wherein the nanoparticles are dispersed in the form of secondarily aggregated particles having an average particle size of 100 nm or more and 20 μm or less in terms of volume Q3, and a silicone powder having an average particle size of 0.5 to 100 μm is dispersed, can achieve the objects of the present invention. Thus, the present invention has been completed.

The present invention will be described hereinafter in detail. Further, "average particle size" used herein means a particle size at which the integrated value in terms of volume in a particle size distribution determined by a leaser diffraction and scattering process is 50%.

The present invention aims at preventing the precipitation of phosphor particles to be added for light conversion. The present invention is a curable resin composition mainly used for an optical semiconductor apparatus, to which nanoparticles having an average particle size of 1 nm or more and less than 100 nm in primary particles are added, wherein the nanoparticles are in a form of secondarily aggregated particles having an average particle size of 100 nm or more and 20 µm or less in the curable resin composition and a silicone powder having an average particle size of 0.5 to 100 µm is dispersed.

As described above, the curable resin composition is in such a state that the nanoparticles are secondarily aggregated in the curable resin composition, and therefore can effectively inhibit a force of movement of phosphor particles due to the gravity and prevent the precipitation. Therefore, even when the dispensing process takes a long time, the amounts of the phosphor particles in an LED apparatus at the early and late stages of the dispensing process can be approximately the same. Further, the handleability of the sealant can be enhanced. Moreover, the curable resin composition has a high resistance to repetitive thermal shock to hardly cause a crack even under a severe temperature cycle, and excellent resistance to discoloration during long-time exposure to high temperature.

The primary particle size of the nanoparticles is 1 nm or more and less than 100 nm, preferably 5 nm or more and 50 nm or less. When the primary particle size is 100 nm or more, the scattering of light emitted from an optical semiconductor occurs. This causes a decrease in brightness when an optical semiconductor apparatus is fabricated. Therefore, it is not preferable. When the primary particle size is less than 1 nm, the handleability is difficult during addition, and control of particle size of secondarily aggregated particles is difficult.

In the present invention, when nanoparticles having a primary particle size within the above-described range are added to a curable resin composition, the nanoparticles are dispersed in the form of secondarily aggregated particles having an average particle size of 100 nm or more and 20 µm or less in terms of volume Q3. The average particle size is preferably 100 nm or more and 10 µm or less. When the average particle size of secondarily aggregated particles is less than 100 nm, the effect of preventing the precipitation of phosphor particles cannot be obtained. This causes color deviation, and therefore it is not preferable. When it exceeds 20 µm, a nozzle used in a dispensing operation is clogged due to the large particle size of the secondarily aggregated particles. This causes the deviation of content of the phosphor particles in the sealant, and therefore it is not preferable.

The form of secondarily aggregated particles having a particle size within the above-described range in a curable resin composition can be obtained by dispersing a combination of nanoparticles described below and the curable resin composition. A process for dispersing nanoparticles in a curable resin composition is not particularly limited, and the known processes can be used. Examples thereof include mixing with various types of mixers, mixing with a planetary centrifugal mixer, and kneading with a roll. In stirring, the inside of a stirring system may be under vacuum for defoaming. Mixing with a simple planetary centrifugal mixer having a vacuuming function is preferable. Further, nanoparticles secondarily aggregated in advance to an intended particle size may be dispersed.

Examples of the nanoparticles may include, but not limited to, as follows.

Nanoparticles may be selected so that the effect of preventing the precipitation of phosphor particles having various shapes and specific gravities in a target product can be obtained and secondary particles moderately aggregated in a curable resin composition (average particle size in terms of Q3: 100 nm or more and 20 µm or less) can be obtained. Further, nanoparticles having a refractive index depending on the objects may be used. Examples of silica include silicas produced by the drying process such as fumed silica and melted silica, and silicas produced by the wet process such as colloidal silica, sol-gel silica, and precipitated silica. Other examples thereof include alumina, magnesium oxide, antimony oxide, aluminum hydroxide, barium sulfate, magnesium carbonate, and barium carbonate. Among them, fumed silica or alumina is suitably used since the volatile content is small and transparency is high.

A nanoparticle may have any shape, and examples of the shape include a sphere shape, a flaky shape, a needle shape, and a plate shape. A sphere shape is preferable since the configuration of secondary aggregation is easily obtained.

The amount of nanoparticles to be added is not particularly restricted as long as the effect of preventing the precipitation of phosphor particles is obtained. The amount of the nanoparticles is preferably 50 parts by mass or less, more preferably 20 parts by mass or less, relative to 100 parts by mass of the curable resin composition. When the addition amount falls within the above-described range, nozzle clogging in the dispensing process may not be caused.

The nanoparticles may be surface-treated with a silane coupling agent to control the secondary particle size. When the surface of the nanoparticles is treated, the aggregability of secondary particles is reduced, and secondary particles having a small particle size can be obtained. Therefore, the silane coupling agent may be selected within such a range that the effect of preventing the precipitation of phosphor particles having various shapes and specific gravities in the intended optical semiconductor apparatus can be obtained and secondary particles moderately aggregated (average particle size in terms of Q3: 100 nm or more and 20 µm or less) can be obtained. Examples of the silane coupling agent include known silane coupling agents such as an alkyl group-containing silane coupling agent, an alkenyl group-containing silane coupling agent, an epoxy group-containing silane coupling agent, a (meth)acrylic group-containing silane coupling agent, an isocyanate group-containing silane coupling agent, an isocyanurate group-containing silane coupling agent, an amino group-containing silane coupling agent, and a mercapto group-containing silane coupling agent.

The curable resin composition of the present invention is a curable resin composition in which the nanoparticles and a silicone powder having an average particle size of 0.5 to 100 µm are dispersed.

The addition of the silicone powder has advantages. A first advantage is that mechanical characteristics are improved. Since the silicon powder has a low elasticity, the silicon powder acts as a relieving agent against stress of thermal shock repetitively caused by turning a light-emitting device on and off. Therefore, a sealing resin which has a high resistance to thermal shock and hardly causes a crack even under a severe temperature cycle is obtained.

Further, properties of the general rubber material such as "specific tackiness and difficulty of strong protection of an LED device due to the rubber material" can be improved. This addition can suppress tackiness and enhance a hardening film.

A second advantage is that resistance to discoloration is improved. It is known that a silicone powder is less tarnished under a high temperature environment. Therefore, the addition of a silicon powder to a sealing resin can suppress discoloration during heating. Further, a silicon powder does not absorb light. The color of a silicone powder is not gradually turned to black by exposure to ultraviolet light from a light-emitting device, unlike other organic resin powders. Therefore, the discoloration of the sealing resin under a high temperature environment can be suppressed. Further, the transparency can be maintained under long-time exposure to ultraviolet light. Accordingly, a light-emitting semiconductor apparatus having a long life span can be obtained.

Examples of the silicone powder include a silicone resin powder which is a polyorgano silsesquioxane fine powder, for example, those disclosed in Japanese Patent Publication No. 40-16917, and Japanese Patent Application Laid-Open Nos. 54-72300, 60-13813, 3-244636, and 4-88023, and a silicone complex powder having a structure in which the surface of a silicone rubber powder is coated with a polyorgano silsesquioxane fine powder (resin), for example, one disclosed in Japanese Patent Application Laid-Open No. 7-196815. These silicone powders may be used alone or in combination of two or more thereof. The silicone powder can be produced by the known production process, and is available as a commercial product.

As such a silicone powder, a silicon powder having an average particle size of 0.5 to 100 μm, more preferably 1 to 15 μm, is used. When the average particle size is less than 0.5 μm and the powders are dispersed in a composition, the powders are aggregated. As a result, the strength of hardened material of the curable resin composition is reduced. Additionally, discoloration is caused by oxidation during heating with an increase in specific surface area. Further, the resistance to discoloration is reduced. When the average particle size exceeds 100 μm, the powders are not homogeneously dispersed in the hardened material and the workability of dispensing is reduced (specifically a string is generated and a dispensing nozzle is clogged). From these viewpoints, it is not preferable.

The content of the silicone powder is preferably 0.1 to 500 parts by mass, more preferably 1 to 100 parts by mass, relative to a total amount of (A) and (B) components described below of 100 parts by mass. When the content is 0.1 parts by mass or more, the resistance to thermal shock, discoloration during heating, gas barrier property of hardened material of the intended resin composition are improved. When the content is 500 parts by mass or less, the composition has a high viscosity. The workability during fabrication of the hardened material may not be reduced. Therefore, this is preferable in terms of industry.

In such silicone powder, examples of the silicone resin powder include KMP590, KMP701, X-52-854, and X-52-1621 available from Shin-Etsu Chemical Co., Ltd., and examples of the silicone complex powder include KMP600, KMP601, KMP602, KMP605, and X-52-7030 available from Shin-Etsu Chemical Co., Ltd. However, the silicone powder is not limited to these silicone powders.

The phosphor particles are not limited as long as they absorb light from a semiconductor light-emitting diode having a nitride-based semiconductor as a light-emitting layer and convert the light into a light having a different wavelength. For example, it is preferable that the phosphor particles be any one or more selected from a nitride-based phosphor and an oxynitride-based phosphor, mainly activated by a lanthanoid series element such as Eu and Ce, an alkaline earth halogen apatite phosphor, an alkaline earth metal borate halogen phosphor, an alkaline earth metal aluminate phosphor, an alkaline earth metal silicate phosphor, an alkaline earth metal sulfide phosphor, an alkaline earth metal thiogallate phosphor, an alkaline earth metal silicon nitride phosphor, and a germanate phosphor, which are mainly activated by a lanthanoid series element such as Eu or a transition metal element such as Mn, and a rare earth aluminate phosphor and a rare earth silicate phosphor, which are mainly activated by a lanthanoid series element such as Ce, an organic complex phosphor mainly activated by a lanthanoid series element such as Eu, and a Ca—Al—Si—O—N-based oxynitride glass phosphor. Specifically, the following phosphor particles can be used, but are not limited.

A nitride-based phosphor particle mainly activated by a lanthanoid series element such as Eu and Ce is $M_2Si_5N_8$:Eu, wherein M is at least one selected from Sr, Ca, Ba, Mg, and Zn. In addition to Sr, Ca, Ba, Mg, Zn, it includes $MSi_7N_{10}$:Eu, $M_{1.8}Si_5O_{0.2}N_8$:Eu, and $M_{0.9}Si_7O_{0.1}N_{10}$:Eu, wherein M is at least one selected from Sr, Ca, Ba, Mg, and Zn.

An oxynitride-based phosphor particle mainly activated by a lanthanoid series element such as Eu and Ce is $MSi_2O_2N_2$:Eu, wherein M is at least one selected from Sr, Ca, Ba, Mg, and Zn.

An alkaline earth metal halogen apatite phosphor particle mainly activated by a lanthanoid series element such as Eu or a transition metal element such as Mn is $M_5(PO_4)_3X$:R, wherein M is at least one selected from Sr, Ca, Ba, Mg, and Zn, X is at least one selected from F, Cl, Br, and I, and R is any one or more of Eu, Mn, Eu, and Mn.

An alkaline earth metal borate halogen phosphor particle is $M_2B_5O_9X$:R, wherein M is at least one selected from Sr, Ca, Ba, Mg, and Zn, X is at least one selected from F, Cl, Br, and I, and R is any one or more of Eu, Mn, Eu, and Mn.

An alkaline earth metal aluminate phosphor particle is $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, or $BaMgAl_{10}O_{17}$:R, wherein R is any one or more of Eu, Mn, Eu, and Mn.

An alkaline earth metal sulfide phosphor particle is $La_2O_2S$:Eu, $Y_2O_2S$:Eu, or $Gd_2O_2S$:Eu.

A rare earth aluminate phosphor particle mainly activated by a lanthanoid series element such as Ce is a YAG-based phosphor particle represented by a composition formula of $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, or $(Y, Gd)_3(Al, Ga)_5O_{12}$. In addition, the particle includes $Tb_3Al_5O_{12}$:Ce or $Lu_3Al_5O_{12}$:Ce, in which a part or all of Y is replaced with Tb, Lu, or the like.

Another phosphor particle is ZnS:Eu, $Zn_2GeO_4$:Mn, or $MGa_2S_4$:Eu, wherein M is at least one selected from Sr, Ca, Ba, Mg, and Zn, X is at least one selected from F, Cl, Br, and I.

The phosphor particles can include one or more selected from Tb, Cu, Ag, Au, Cr, Nd, Dy, Co, Ni, and Ti, if necessary, in place of Eu or in addition to Eu.

A Ca—Al—Si—O—N-based oxynitride glass phosphor particle is a phosphor particle including as a base material oxynitride glass which has 20 to 50% by mole of $CaCO_3$ in terms of CaO, 0 to 30% by mole of $Al_2O_3$, 25 to 60% by mole of $SiO$, 5 to 50% by mole of AlN, and 0.1 to 20% by mole of rare earth oxide or transition metal oxide, provided that a total amount of five components is 100% by mole. It is preferable that a phosphor particle including oxynitride glass as a base material have a nitrogen content of 15% by weight or less. In addition to a rare earth oxide ion, other rare earth element ions forming a sensitizer in a form of rare earth oxide is preferably contained in a content of 0.1 to 10% by mole as a co-activating agent in fluorescent glass.

A phosphor particle which is other than the above-described phosphor particles and has the same performance and effect can be also used.

The curable resin composition contains at least one of a silicone resin, a modified silicone resin, an epoxy resin, and a modified epoxy resin, and have a viscosity at room temperature (within a range of 5 to 35° C.) of 100 mPa·s or more and 10,000 mPa·s or less, preferably 100 mPa·s or more and 5,000 mPa·s or less. When the viscosity is 100 mPa·s or more, the effect of preventing the precipitation of phosphor particles is obtained, and color deviation can be improved. When it is 10,000 mPa·s or less, there is no fear in which the workability is reduced due to a reduced speed during discharging in the dispensing process, the amount of a filler to be filled varies by generation of a string of the sealant, and an apparatuses polluted.

From the viewpoint of transparency, heat resistance, and light resistance, the curable resin composition of the present invention preferably contains a silicone resin and a modified silicone resin.

The curable silicone resin composition and curable modified silicone resin composition are useful as an optical coating material such as sealing materials for a light-emitting diode or an LED device. The following composition is preferable as long as it is a curable silicone resin composition, but the curable resin composition is not limited to this composition.

Curable Silicone Resin Composition

The curable silicone resin composition effective in the present invention preferably contains the following (A) to (C) components, and further a (D) component. The components will be described in detail.

(A) Component

An (A) component used in the present invention is a straight chain-diorganopolysiloxane having a repeating unit of diaryl siloxane as a main chain. Organopolysiloxane in the (A) component may be used alone. Alternatively, two or more kinds of organopolysiloxanes having different molecular weights and different organic groups bonded to a silicon atom may be used in combination.

(A) Compound having a structure represented by the following general formula (1),

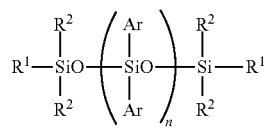

(1)

wherein, $R^1$ represents an aliphatic unsaturated group, $R^2$ represents the same or different unsubstituted or substituted monovalent hydrocarbon group, Ar represents an aryl group optionally having the same or different heteroatom, and "n" is an integer of 1 or more.

In the (A) component, an aryl group represented by Ar of the formula (1) includes an aromatic hydrocarbon group such as a phenyl group or a naphthyl group, or an aromatic group having a heteroatom (O, S, N) such as a furanyl group. Further, the aryl group may include a substituent such as a halogen atom (e.g., a chlorine atom, a bromine atom, and a fluorine atom). Ar is preferably an unsubstituted aromatic hydrocarbon group, particularly preferably a phenyl group.

Examples of an unsubstituted or substituted monovalent hydrocarbon group represented by $R^2$ of the formula (1) in the (A) component include the following aliphatic unsaturated groups and monovalent hydrocarbon groups other than these aliphatic unsaturated groups. Illustrative examples thereof include an alkyl group having 1 to 6 carbon atoms such as a methyl group, an ethyl group, a propyl group, an isopropyl group, a butyl group, an isobutyl group, a sec-butyl group, and a tert-butyl group; a haloalkyl group having 1 to 4 carbon atoms such as a chloromethyl group and a 3,3,3-trifluoropropyl group; an aryl group having 6 to 10 carbon atoms such as a phenyl group and a tolyl group. Among monovalent hydrocarbon groups other than the aliphatic unsaturated groups, an alkyl group having 1 to 6 carbon atoms, a phenyl group, and a vinyl group are preferable, and a methyl group is particularly preferable.

The aliphatic unsaturated group represented by $R^1$ of the formula (1) is not limited as long as the composition of the present invention can be stably maintained in an unhardened state until an addition reaction is initiated and the composition can be easily hardened after initiation of the addition reaction. Examples thereof include an ethylenically unsaturated group and an acetylenically unsaturated group. At least two aliphatic unsaturated groups which may be the same or different are contained per molecule. As described above, it is preferable that the (A) component contain an aliphatic unsaturated group in both terminals.

The (A) component in the curable silicone composition contains a compound having a structure represented by the following general formula (1') and at least two aliphatic unsaturated groups per molecule,

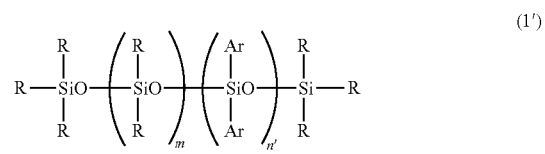

(1')

wherein, R represents the same or different unsubstituted or substituted monovalent hydrocarbon group, Ar represents an aryl group optionally having the same or different heteroatom, "m" is an integer of 0 or 1 or more, and "n'" is an integer of 1 or more.

In the (A) component, an aryl group represented by Ar of the formula (1') may include an aromatic hydrocarbon group such as a phenyl group or a naphthyl group, or an aromatic group having a heteroatom (O, S, N) such as a furanyl group. Further, the aryl group may include substituents such as a halogen atom (e.g., a chlorine atom, a bromine atom, and a fluorine atom). Ar is preferably an unsubstituted aromatic hydrocarbon group, particularly preferably a phenyl group.

Examples of an unsubstituted or substituted monovalent hydrocarbon group represented by R of the formula (1') in the (A) component include the following aliphatic unsaturated groups and monovalent hydrocarbon groups other than these aliphatic unsaturated groups. Examples thereof include an alkyl group having 1 to 6 carbon atoms such as a methyl group, an ethyl group, a propyl group, an isopropyl group, a butyl group, an isobutyl group, a sec-butyl group, and a tert-butyl group; a haloalkyl group having 1 to 4 carbon atoms such as a chloromethyl group and a 3,3,3-trifluoropropyl group; an aryl group having 6 to 10 carbon atoms such as a phenyl group and a tolyl group. Among monovalent hydrocarbon groups other than the aliphatic unsaturated groups, an alkyl group having 1 to 6 carbon atoms and a phenyl group are preferable, and a methyl group is particularly preferable.

The aliphatic unsaturated group represented by R of the formula (1') is not limited as long as the composition of the present invention can be stably maintained in an unhardened state until an addition reaction is initiated and the composition can be easily hardened after initiation of the addition reaction. Examples thereof include an ethylenically unsaturated group and an acetylenically unsaturated group. At least two aliphatic unsaturated groups which may be the same or different are contained per molecule. As described above, it is preferable that the (A) component contain an aliphatic unsaturated group in both terminals.

The "ethylenically unsaturated group" used herein means an organic group which has a carbon-carbon double bond and contains or does not contain a heteroatom such as an oxygen atom or a nitrogen atom. Illustrative examples thereof include an alkenyl group having 2 to 20 carbon atoms, preferably 2 to 10 carbon atoms such as a vinyl group, an allyl group, a 5-hexenyl group, a propenyl group, and a butenyl group; an alkadienyl group having 4 to 10 carbon atoms such as 1,3-butadiene; a combination of the alkenyl group and a carbonyloxy group such as an acryloyloxy group (—O(O)CCH=CH$_2$) and a metacryloyloxy group (-O(O)CC(CH$_3$)—CH$_2$); a combination of the alkenyl group and a carbonylamino group such as an acrylamido group (—NH(O)CCH=CH$_2$).

The "acetylenically unsaturated group" used herein means an organic group which has a carbon-carbon triple bond and contains or does not contain a heteroatom such as an oxygen atom or a nitrogen atom. Illustrative examples thereof include an alkynyl group having 2 to 20 carbon atoms, preferably 2 to 10 carbon atoms such as an ethynyl group and a propargyl group; a combination of the alkynyl group and a carbonyloxy group such as an ethynyl carbonyloxy group (-O(O)CC≡CH).

Among them, from the viewpoint of productivity and cost when a starting material for the (A) component is obtained, the aliphatic unsaturated group is preferably the alkenyl group described above, more preferably a vinyl group, an allyl group, or a 5-hexenyl group, particularly preferably a vinyl group.

In the (A) component, the polymerization degrees n and n' of diarylsiloxane unit are an integer of 1 or more, preferably an integer of 1 to 100, more preferably an integer of 1 to 20, further preferably an integer of 2 to 10.

The (A) component can be obtained by hydrolysis and condensation of difunctional silane such as dichlorodiphenylsilane or dialkoxydiphenylsilane, followed by or at the same time as end-capping with an aliphatic unsaturated group-containing end-capping agent.

(B) Component

A (B) component has an organosilicon compound (SiH group-containing organosilicon compound) having at least two hydrogen atoms bonded to a silicon atom (i.e., SiH group) per molecule and no aliphatic unsaturated group, and is subjected to a hydrosilylation addition reaction with the (A) component and acts as a crosslinking agent. These (B) components may be used alone or in a combination of two or more kinds thereof. As the (B) component, any known compound can be used as long as it is a silicon compound having at least two SiH groups per molecule.

An organic group bonded to the silicon atom in the (B) component is an unsubstituted monovalent hydrocarbon group having no aliphatic unsaturated group or a monovalent hydrocarbon group substituted with a halogen atom (e.g., chlorine atom, bromine atom, or fluorine atom), an epoxy group-containing group (e.g., epoxy group, glycidyl group, glycidoxy group), or an alkoxy group (e.g., methoxy group, ethoxy group, propoxy group, or butoxy group). Examples of the monovalent hydrocarbon group include an alkyl group having 1 to 6 carbon atoms; a haloalkyl groups having 1 to 4 carbon atoms; and an aryl group having 6 to 10 carbon atoms, which are specifically exemplified an unsubstituted or substituted monovalent hydrocarbon group of R$^2$ of the formula (1) and R of the formula (1') in the (A) component. The organic group is preferably an alkyl group having 1 to 6 carbon atoms or an aryl group having 6 to 10 carbon atoms, more preferably a methyl group or a phenyl group. When a substituent of the monovalent hydrocarbon group has an epoxy group-containing group and/or an alkoxy group, the adhesion can be imparted to the hardened material of the composition of the present invention.

When the (B) component is an organohydrogensiloxane having at least two SiH groups per molecule, the molecular structure of the organohydrogensiloxane is not particularly limited. For example, various organohydrogensiloxanes conventionally fabricated, which have straight-chain, cyclic, branched-chain, and three-dimensional structures (resin state), can be used.

The organohydrogensiloxanes have at least two (usually about 2 to 300), preferably 3 or more (usually about 3 to 200, preferably about 4 to 100) SiH groups per molecule. When the organohydrogensiloxane have a straight-chain structure or a branched-chain structure, the SiH groups may be positioned in a terminal moiety or an internal moiety of the molecular chain or both the moieties.

The number (polymerization degree) of silicon atoms in one molecule of the organohydrogensiloxane is preferably 2 to 1,000, more preferably 3 to 200, further preferably about 4 to 100. Further, the organohydrogensiloxane preferably has a liquid form at 25° C., and the viscosity measured at 25° C. with a rotary viscometer is preferably 1 to 1,000 mPa·s, more preferably about 10 to 100 mPa·s.

As the organohydrogensiloxane, for example, a compound represented by the following average composition formula (2) can be used,

$$R^3_a H_b SiO_{(4-a-b)/2} \quad (2)$$

wherein, R$^3$ represents the same or different unsubstituted or substituted monovalent hydrocarbon group bonded to a silicon atom, provided that the aliphatic unsaturated group is not included, and "a" and "b" are a positive number satisfying 0.7≤a≤2.1, 0.001≤b≤1.0, and 0.8≤a+b≤3.0, preferably 1.0≤a≤2.0, 0.01≤b≤1.0, and 1.5≤a+b≤2.5.

Examples of R$^3$ include an alkyl group having 1 to 6 carbon atoms or a haloalkyl groups having 1 to 4 carbon atoms, and an aryl group having 6 to 10 carbon atoms, which are specifically exemplified an unsubstituted or a substituted monovalent hydrocarbon group other than the aliphatic unsaturated groups of the formula (1) in the (A) component. R$^3$ is preferably an alkyl group having 1 to 6 carbon atoms or an aryl group having 6 to 10 carbon atoms, more preferably a methyl group or a phenyl group.

Examples of the organohydrogensiloxane represented by the average composition formula (2) include a cyclic compound having at least four organohydrogensiloxane units represented by a formula: R$^3$HSiO, a compound represented by a formula: R$^3_3$SiO(HR$^3$SiO)$_s$SiR$^3_3$, a compound represented by a formula: HR$^3_2$SiO(HR$^3$SiO)$_s$SiR$^3$H, and a compound represented by a formula: HR$^3$SiO(HR$^3$SiO)$_s$(R$^3_2$SiO)$_t$SiR$^3_2$H. In the formulae, R$^3$ has the same meanings as before, and "s" and "t" are each a positive number of 1 or less.

Alternatively, the organohydrogensiloxane represented by the above-described average composition formula (2) may contain a siloxane unit represented by a formula: HSiO$_{1.5}$, a siloxane unit represented by a formula: R$^3$HSiO, and/or a siloxane unit represented by a formula: R$^3_2$HSiO$_{0.5}$. The organohydrogensiloxane may contain a monoorganosiloxane unit, a diorganosiloxane unit, a triorganosiloxane unit, and/or a SiO$_{4/2}$ unit, which have no SiH group. In the formulae, R$^3$ has the same meanings as before.

Illustrative examples of the (B) component include 1,1,3,3-tetramethyldisiloxane, 1,3,5,7-tetramethylcyclotetrasiloxane, tris(hydrogendimethylsiloxy)methylsilane, tris(hydrogendimethylsiloxy)phenylsilane, methylhydrogencyclopolysiloxane, a methylhydrogensiloxane-dimethylsiloxane cyclic copolymer, a methylhydrogenpolysiloxane having both molecular terminals capped with trimethylsiloxy groups, a dimethylsiloxane-methylhydrogensiloxane copolymer having both molecular terminals capped with trimethylsiloxy groups, a diphenylsiloxane-methylhydrogensiloxane copolymer having both molecular terminals capped with trimethylsiloxy groups, a methylphenylsiloxane-methylhydrogensiloxane copolymer having both molecular terminals capped with trimethylsiloxy groups, a dimethylsiloxane-methylhydrogensiloxane-methylphenylsiloxane copolymer having both molecular terminals capped with trimethylsiloxy groups, a dimethylsiloxane-methylhydrogensiloxane-diphenylsiloxane copolymer having both molecular terminals capped with trimethylsiloxy groups, a methylhydrogenpolysiloxane having both molecular terminals capped with dimethylhydrogensiloxy groups, a dimethylpolysiloxane having both molecular terminals capped with dimethylhydrogensiloxy groups, a dimethylsiloxane-methylhydrogensiloxane copolymer having both molecular terminals capped with dimethylhydrogensiloxy groups, a dimethylsiloxane-methylphenylsiloxane copolymer having both molecular terminals capped with dimethylhydrogensiloxy groups, a dimethylsiloxane-diphenylsiloxane copolymer having both molecular terminals capped with dimethylhydrogensiloxy groups, a methylphenylpolysiloxane having both molecular terminals capped with dimethylhydrogensiloxy groups, a diphenylpolysiloxane having both molecular terminals capped with dimethylhydrogensiloxy groups, a diphenylsiloxane-methylhydrogensiloxane copolymer having both molecular terminals capped with dimethylhydrogensiloxy groups, an organohydrogensiloxane in which some or all methyl groups in the above-described compounds are substituted with other alkyl groups such as an ethyl group and a propyl group, an organosiloxane copolymer having a siloxane unit represented by a formula: $R^3_3SiO_{0.5}$, a siloxane unit represented by a formula: $R^3_2HSiO_{0.5}$, and a siloxane unit represented by a formula: $SiO_2$, an organosiloxane copolymer having a siloxane unit represented by a formula: $R^3_2HSiO_{0.5}$ and a siloxane unit represented by a formula: $SiO_2$, an organosiloxane copolymer having a siloxane unit represented by a formula: $R^3HSiO$, and one or both of a siloxane unit represented by a formula: $R^3SiO_{1.5}$ and a siloxane unit represented by a formula: $HSiO_{1.5}$, and a mixture of two or more kinds of these organopolysiloxanes. In the formulae, $R^3$ has the same meanings as before.

The amount of the (B) component to be blended is an amount sufficient to harden the composition of the present invention in the presence of a hydrosilylation catalyst of the (C) component, and is usually such an amount that the molar ratio of the SiH group in the (B) component to the aliphatic unsaturated group in the (A) component is 0.2 to 5, preferably 0.5 to 2.

(C) Component

Any catalyst may be used as a platinum group metal series catalyst for hydrosilylation as long as it promotes a hydrosilylation addition reaction of an aliphatic unsaturated group bonded to a silicon atom in the (A) component with a SiH group in the (B) component. These (C) compounds may be used alone or in a combination of two or more kinds thereof. Examples of the (C) component include platinum group metal such as platinum, palladium, and rhodium, a platinum group metal compound such as chloroplatinic acid, alcohol-modified chloroplatinic acid, a coordination compound of chloroplatinic acid with olefins, vinylsiloxane, or an acetylene compound, tetrakis(triphenylphosphine) palladium, and chlorotris(triphenylphosphine) rhodium. A platinum compound is particularly preferable.

The amount of the (C) component to be blended may be an amount effective in a hydrosilylation catalyst. The amount in terms of mass of platinum group metal element falls within a range of 0.1 to 1,000 ppm, more preferably 1 to 500 ppm, relative to the total amount of the (A) and (B) components.

(D) Component

To the curable silicone resin composition effectively used in the present invention, the (D) component may be added to obtain hardness after hardening.

The (D) component to be used is an organopolysiloxane having a branched or a three-dimensional structure represented by the following average composition formula (3), $$R^0_c(C_6H_5)_d SiO_{(4-c-d)/2} \qquad (3)$$

wherein, $R^0$ represents the same or different substituted or unsubstituted monovalent hydrocarbon group, an alkoxy group, or hydroxyl group, 0.1 to 80% by mole of all $R^0$ is an alkenyl group, and "c" and "d" are a positive number satisfying $1 \leq c+d \leq 2$ and $0.20 \leq d/(c+d) \leq 0.95$.

As understood from $1 \leq c+d \leq 2$ in the average composition formula (1), the organopolysiloxane has a branched or a three-dimensional structure containing one or two or more of a $R^0SiO_{3/2}$ unit, a $(C_6H_5)SiO_{3/2}$ unit, and a $SiO_2$ unit per molecule.

In the formula (3), $C_6H_5$ is a phenyl group, $R^0$ is a substituted or an unsubstituted monovalent hydrocarbon group except for a phenyl group, an alkoxy group, or a hydroxyl group, preferably a substituted or an unsubstituted monovalent hydrocarbon group having 1 to 20 carbon atoms, particularly preferably 1 to 10 carbon atoms, an alkoxy group, or a hydroxyl group. Illustrative examples of such a hydrocarbon group include an alkyl group such as a methyl group, an ethyl group, a propyl group, a butyl group, a pentyl group, a hexyl group, a cyclohexyl group, and a heptyl group; an aryl group, except for a phenyl group, such as a tolyl group, a xylyl group, and a naphthyl group; an aralkyl group such as a benzyl group, and a phenethyl group; an unsaturated hydrocarbon group including an alkenyl group such as a vinyl group, an allyl group, a butenyl group, a pentenyl group, a hexenyl group, and a heptenyl group; a halogenated alkyl group such as a chloromethyl group, a 3-chloropropyl group, and a 3,3,3-trifluoropropyl group. Examples of an alkoxy group include an unsubstituted alkoxy group such as a methoxy group, an ethoxy group, a propoxy group, and a phenoxy group, and an alkoxy-substituted alkoxy group such as a methoxyethoxy group and an ethoxyethoxy group.

In the present invention, it is preferable that 0.1 to 80% by mole, preferably 0.5 to 50% by mole of all $R^0$ be an alkenyl group. When the content of the alkenyl group is 0.1% by mole or more, a hardness necessary for a silicone resin is obtained. When it is 80% by mole or less, there are too many cross-linking points. Therefore, a silicone resin may not be fragile. Further, c and d are a positive number satisfying $1 \leq c+d \leq 2$, preferably $1.2 \leq c+d < 1.9$, and $0.20 \leq d/(c+d) \leq 0.95$, preferably $0.25 \leq d/(c+d) \leq 0.90$. When c+d is 1 or more and 2 or less, necessary hardness and strength can be obtained. When the content of the phenyl group falls within such a range, hardness and strength necessary for a silicone resin can be obtained. It is preferable that the alkyenyl group be a vinyl group.

The amount of the (D) component to be blended is an amount sufficient to obtain a desired hardness of a resin composition after hardening, and is usually 0 to 500 parts by mass relative to 100 parts by mass of the (A) component.

Curable Modified Silicone Resin Composition

Each component of a curable modified silicone resin composition effective in the present invention will be described in detail.

(E) Component

A (E) component is a polycyclic hydrocarbon group-containing organosilicon compound which is a product of addition reaction of (X) an organosilicon compound having two hydrogen atoms bonded to a silicon atom per molecule, and (Y) a polycyclic hydrocarbon compound having two hydrosilylation reactive carbon-carbon double bonds per molecule and has two carbon-carbon double bonds bonded to silicon atoms per molecule.

(X) Component

The (X) component is a reaction starting material for the (E) component, and is a compound having at least two SiH groups, preferably a compound represented by the following general formula (4),

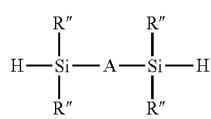

(4)

wherein, A represents a divalent group selected from the group consisting of a group represented the following general formula (5),

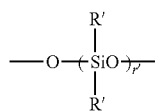

(5)

wherein R' independently represents an unsubstituted or substituted monovalent hydrocarbon group having 1 to 12 carbon atoms or an alkoxy group having 1 to 6 carbon atoms, and "r'" is an integer of 0 to 100, and a group represented by the following structural formula (6),

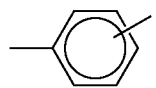

(6)

wherein R" independently represents an unsubstituted or substituted monovalent hydrocarbon group having 1 to 12 carbon atoms or an alkoxy group having 1 to 6 carbon atoms.

When in the compound that is represented by the general formula (4) and has two hydrogen atoms bonded to silicon atoms (hereinafter sometimes referred to as "SiH") per molecule, A in the general formula (4) is a divalent group represented by the general formula (5), the compound is a compound represented by the following general formula (7),

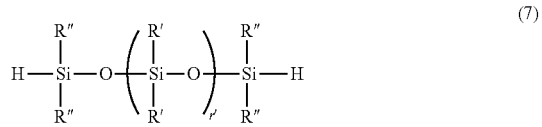

(7)

wherein each of R" and R' independently represents an unsubstituted or substituted monovalent hydrocarbon group having 1 to 12 carbon atoms, preferably 1 to 6 carbon atoms, or an alkoxy group having 1 to 6 carbon atoms, preferably 1 to 4 carbon atoms, and "r'" is an integer of 0 to 100, preferably 0 to 10.

When R" and R' of the formulae are the monovalent hydrocarbon group described above, examples of the monovalent hydrocarbon group include an alkyl group such as a methyl group, an ethyl group, a propyl group, an isopropyl group, a butyl group, a tert-butyl group, a pentyl group, an isopentyl group, a hexyl group, and a sec-hexyl group; a cycloalkyl group such as a cyclopentyl group, and a cyclohexyl group; an aryl group such as a phenyl group and a o-, m-, or p-tolyl group; an aralkyl group such as a benzyl group, and a 2-phenylethyl group; an alkenyl group such as a vinyl group, an allyl group, 1-butenyl group, and a 1-hexenyl group; an alkenylaryl group such as a p-vinylphenyl group; groups in which at least one hydrogen atom bonded to a carbon atom within the above-described groups has been substituted with a halogen atom, a cyano group, or an epoxy ring-containing group, including a halogenated alkyl group such as a chloromethyl group, a 3-chloropropyl group, and a 3,3,3-trifluoropropyl group; a 2-cyanoethyl group; and a 3-glycidoxypropyl group.

When R" and R' are the alkoxy group described above, examples of the alkoxy group include a methoxy group, an ethoxy group, a propoxy group, an isopropoxy group, a butoxy group, a sec-butoxy group, and a tert-butoxy group.

Among them, R" and R' are preferably groups other than an alkenyl group and an alkenylaryl group, particularly preferably all methyl groups since industrial fabrication is simple and the availability is easy.

Illustrative examples of the structural formula suitable for the compound represented by the general formula (7) are shown below, but the compound is not limited to the following structural formula. Hereinafter, "Me" represents a methyl group.

$HMe_2SiOSiMe_2H$ $HMe_2SiO(Me_2SiO)SiMe_2H$ $HMe_2SiO(Me_2SiO)_4SiMe_2H$ $HMe_2SiO(Me_2SiO)_8SiMe_2H$ $HMe_2SiO(Me_2SiO)_{12}SiMe_2H$

Here, the compound represented by the general formula (4) may be used alone or in a combination of two or more kinds.

When in the compound that is a reaction starting material for the (E) component, is represented by the general formula (4), and has two SiH groups per molecule, A of the general formula (4) is a divalent group represented by the general formula (6), the compound is a compound represented by the following general formula (8),

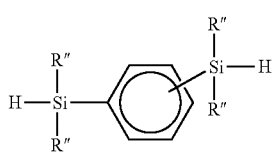
(8)

wherein R" is as defined in the general formula (7).

Examples of R" in the general formula (8) include those described in examples of R" in the general formula (7). R" is preferably groups other than an alkenyl group and an alkenylaryl group, particularly preferably all methyl groups.

Examples of the compound represented by the general formula (8) include a silphenylene compound such as 1,4,-bis(dimethylsilyl)benzene represented by a structural formula: $HMe_2Si$-p-$C_6H_4$—$SiMe_2H$, and 1,3,-bis(dimethylsilyl)benzene represented by a structural formula: $HMe_2Si$-m-$C_6H_4$—$SiMe_2H$.

The compounds represented by the general formula (8) may be used alone or in a combination of two or more kinds.

The (X) component that is a reaction starting material for the (E) component may be used alone or in a combination of two or more kinds.

(Y) Component

In (Y) a polycyclic hydrocarbon having two addition reactive (hydrosilylation reactive) carbon-carbon double bonds per molecule that is a reaction starting material for the (E) component, "addition reactive" means a property which may be subjected to addition of a hydrogen atom bonded to a silicon atom (known as a hydrosilylation reaction).

The (Y) component may be any of (i) a component having an addition reactive carbon-carbon double bond formed between two adjacent carbon atoms among carbon atoms forming a polycyclic scaffold of a polycyclic hydrocarbon, (ii) a component in which hydrogen atom bonded to a carbon atom forming a polycyclic scaffold of a polycyclic hydrocarbon is substituted with an addition reactive carbon-carbon double bond, (iii) a component in which an addition reactive carbon-carbon double bond is formed between two adjacent carbon atoms among carbon atoms forming a polycyclic scaffold of a polycyclic hydrocarbon, and a hydrogen atom bonded to a carbon atom forming a polycyclic scaffold of a polycyclic hydrocarbon is substituted with an addition reactive carbon-carbon double bond.

Examples of the (Y) component include 5-vinylbicyclo[2.2.1]hept-2-en represented by the following structural formula (x),

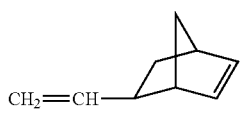
(x)

6-vinylbicyclo[2.2.1]hept-2-en represented by the following structural formula (y),

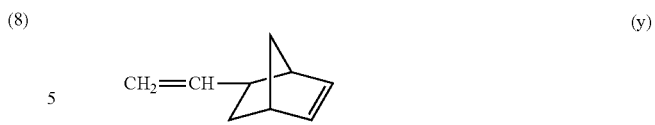
(y)

a combination of both (hereinafter, collectively referred to as "vinylnorbornene" when the three compounds need not be distinguished) and dicyclopentadiene represented by the following structural formula (z),

(z)

The site of substitution of vinyl group of the vinylnorbornen may be cis configuration (exo form) or trans configuration (endo form). Since the reactivities of the components are not particularly different due to a difference between the configurations, a combination of isomers having both the configurations may be used.

Preparation of (E) Component

The (E) component of the composition of the present invention can be obtained by an addition reaction of the (Y) component having two addition reactive carbon-carbon double bond per molecule in an excess amount of 1 mole or more and 10 moles or less, preferably 1 mole or more and 5 moles or less relative to 1 mole of the (X) component having two SiH groups per molecule, in the presence of a hydrosilylation catalyst as an addition reaction product having no SiH group.

The (E) component thus obtained may include an addition reactive carbon-carbon double bond derived from the (X) component (specifically, derived from R" of the general formula (4) and/or R' of the general formula (5)), in addition to an addition reactive carbon-carbon double bond. Therefore, at least two addition reactive carbon-carbon double bonds are contained in one molecule. The number of the double bonds is preferably 2 to 6, more preferably 2. When the number of the addition reactive carbon-carbon double bonds is too large, the hardened material obtained by hardening the composition of the present invention is likely to be cracked.

As the hydrosilylation reaction catalyst, all the conventionally known catalysts can be used. Examples thereof include a platinum-based catalyst such as carbon powder-supporting platinum metal, platinum black, platinic chloride, chloroplatinic acid, a reaction product of chloroplatinic acid with monohydric alcohol, a complex of chloroplatinic acid with olefins, platinum bisacetoacetate, and a platinum group metal series catalyst such as a palladium-based catalyst and a rhodium-based catalyst. The addition reaction conditions and use of a solvent are not particularly limited, and may be the same as in the ordinary method.

As described above, since an excess molar amount of the (Y) component relative to the amount of (X) component is used in preparation of the (E) component, the (E) component has two addition reactive carbon-carbon double bonds derived from the structure of the (Y) component per molecule. Further, the (E) component has a residue derived from the (X) component. The residue may contain a structure which is derived from the structure of the (Y) component and is bonded via a divalent residue of polycyclic hydrocarbon having no addition reactive carbon-carbon double bond.

Therefore, examples of the (E) component include compounds represented by the following general formula (9), $$N\text{-}M\text{-}(N'\text{-}M)_p\text{-}N \qquad (9)$$

wherein, M represents a divalent residue of a compound of the (X) component, N represents a monovalent residue of polycyclic hydrocarbon of the (Y) component, N' represents a divalent residue of the (Y) component, and "p" is an integer of 0 to 10, preferably 0 to 5.

Further, the number "p" of repeating units represented by (N'-M) can be set by adjusting an excess molar amount of the (Y) component that reacts with 1 mole of the (X) component.

Illustrative examples of N of the general formula (9) include monovalent residues represented by the following structural formulae,

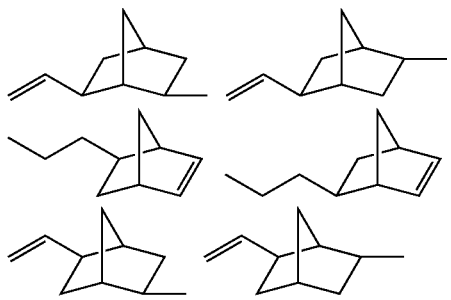

(hereinafter, collectively referred to as "NB group" when the six residues need not be distinguished, or abbreviated to "NB" when the structures of the six residues are not discriminated),
and monovalent residues represented by,

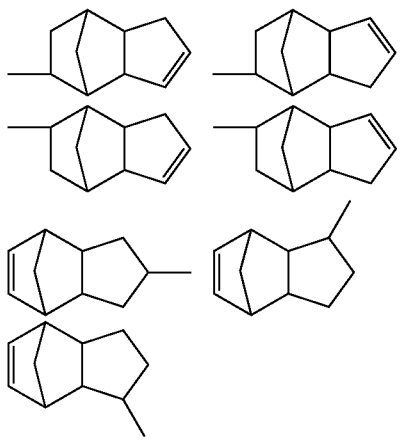

(hereinafter, abbreviated to "DCP" when the seven residues need not be distinguished).

Illustrative examples of N' of the general formula (9) include divalent residues represented by the following structural formulae,

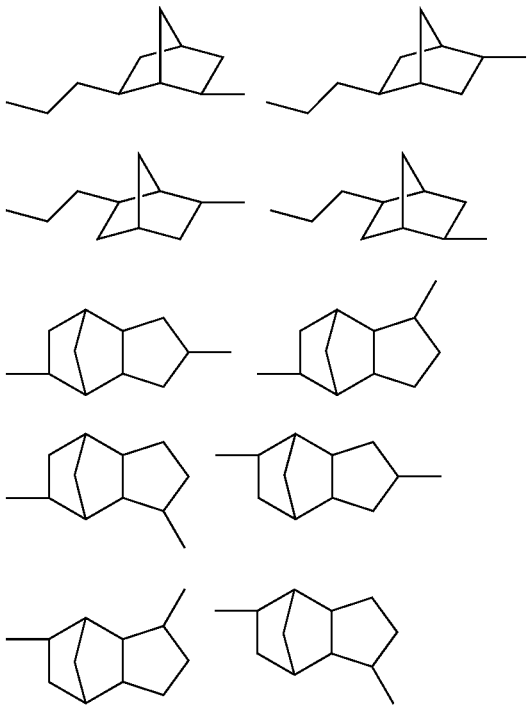

Provided that the bilateral directions of asymmetric divalent residues represented by the structural formulae are not limited to the above-described structures, and the structural formulae substantively contain structures in which the above-described structures are rotated 180° in the plane of the paper.

Specifically, suitable examples of the (E) component represented by the general formula (9) include as follows, but the present invention is not limited to these. (here, "NB" and "DCP" have the same meanings as above.)

NB-Me$_2$SiOSiMe$_2$-NB
NB-Me$_2$SiO(Me$_2$SiO)SiMe$_2$-NB
NB-Me$_2$SiO(Me$_2$SiO)$_4$SiMe$_2$-NB
NB-Me$_2$SiO(Me$_2$SiO)$_8$SiMe$_2$-NB
NB-Me$_2$SiO(Me$_2$SiO)$_{12}$SiMe$_2$-NB
NB-Me$_2$Si-p-C$_6$H$_4$—SiMe$_2$-NB
NB-Me$_2$Si-m-C$_6$H$_4$—SiMe$_2$-NB

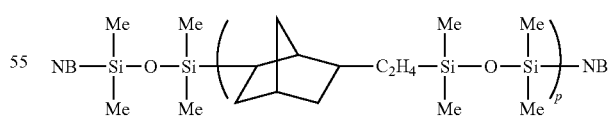

wherein, "p" represents an integer of 1 to 10.

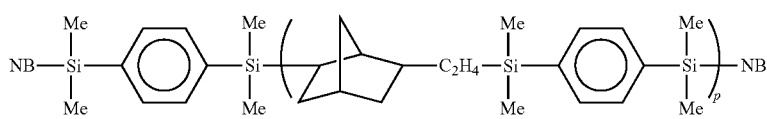

wherein, "p" represents an integer of 1 to 10.
DCP-Me$_2$SiOSiMe$_2$-DCP
DCP-Me$_2$SiO(Me$_2$SiO)SiMe$_2$-DCP
DCP-Me$_2$SiO(Me$_2$SiO)$_4$SiMe$_2$-DCP
DCP-Me$_2$SiO(Me$_2$SiO)$_8$SiMe$_2$-DCP
DCP-Me$_2$SiO(Me$_2$SiO)$_{12}$SiMe$_2$-DCP
DCP-Me$_2$Si-p-C$_6$H$_4$—SiMe$_2$-DCP
DCP-Me$_2$Si-m-C$_6$H$_4$—SiMe$_2$-DCP

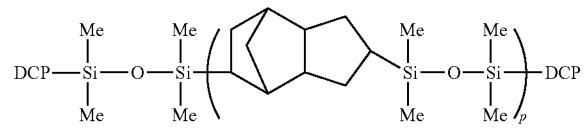

wherein, "p" represents an integer of 1 to 10.

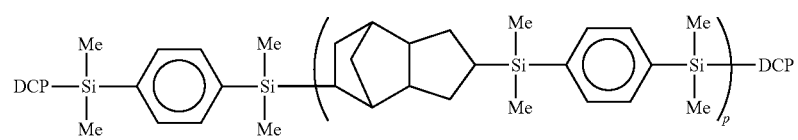

wherein, "p" represents an integer of 1 to 10.

The (E) component of the present invention can be used alone or in a combination of two or more kinds.

(F) Component

A (F) component of the present invention is a siloxane compound having three or more SiH groups per molecule, or an organic modified siloxane compound. SiH in the (F) component is added by a hydrosilylation reaction with at least two addition reactive carbon-carbon double bonds per molecule of the (E) component, to obtain a hardened material having a three-dimensional net structure.

Examples of the (F) component include a cyclic siloxane compound represented by the following general formula (10),

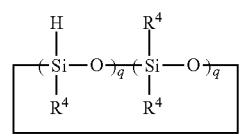

wherein, R$^4$ independently represents a hydrogen atom or an unsubstituted or substituted monovalent hydrocarbon group having 1 to 12 carbon atoms, preferably 1 to 6 carbon atoms, other than an alkyenyl group, q is an integer of 3 to 10, preferably 3 to 8, "r" represents an integer of 0 to 7, preferably 0 to 2, and q+r is an integer of 3 to 10, preferably 3 to 6.

When R$^4$ of the general formula (10) is an unsubstituted or substituted monovalent hydrocarbon group other than an alkyenyl group, examples of the (F) component include an alkyl group such as a methyl group, an ethyl group, a propyl group, an isopropyl group, a butyl group, a tert-butyl group, a pentyl group, a isopentyl group, a hexyl group, and a sec-hexyl group; a cycloalkyl group such as a cyclopentyl group, and a cyclohexyl group; an aryl group such as a phenyl group and a o-, m-, or p-tolyl group; an aralkyl group such as a benzyl group and a 2-phenylethyl group; an alkenylaryl group such as a p-vinylphenyl group; and groups in which at least one hydrogen atom bonded to a carbon atom within the above-described groups has been substituted with a halogen atom, a cyano group, or an epoxy ring-containing group. Examples thereof include a halogenated alkyl group such as a chloromethyl group, a 3-chloropropyl group, and a 3,3,3-trifluoropropyl group; a 2-cyanoethyl group; and a 3-glycidoxypropyl group.

Among them, R$^4$ is preferably all a methyl group (for example, the (F) component is 1,3,5,7-tetramethyl cyclotetrasiloxane) since industrial fabrication is simple and the availability is easy.

Examples of the (F) component include an addition reaction product having three or more SiH groups per molecule obtained by a hydrosilylation reaction of one or two of vinylnorbornenes (5-vinyl bicyclo[2.2.1]hept-2-ene, 6-vinyl bicycl[2.2.1]hept-2-ene) with 1,3,5,7-tetramethyl cyclotetrasiloxane, for example, a compound represented by the following general formula (11),

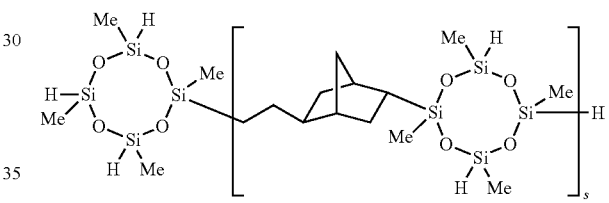

(11)

wherein, "s" represents an integer of 1 to 100, preferably 1 to 10.

Specifically, suitable examples of the (F) component include, but not limited to, as follows.
(HMeSiO)$_3$
(HMeSiO)$_4$
(HMeSiO)$_3$(Me2SiO)
(HMeSiO)$_4$(Me2SiO)
HMe$_2$SiO(Ph2SiO)$_2$(MeHSiO)$_2$SiMe$_2$H
(HMe$_2$SiO)$_3$SiPh

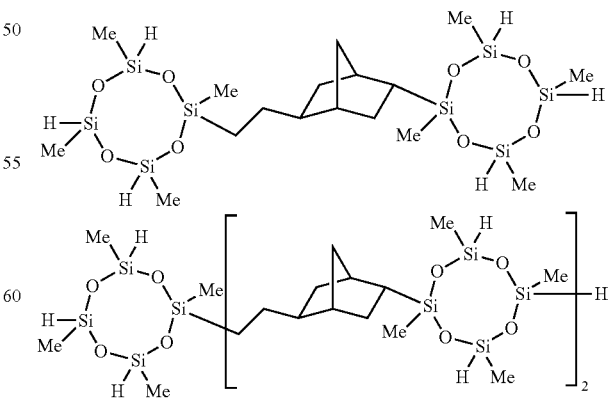

The (F) component of the present invention can be used alone or in a combination of two or more kinds.

The amount of the (F) component to be blended is preferably set as follows. As described below, the composition of the present invention contains a component having a hydrogen atom bonded to a silicon atom other than the (F) component, and/or a component having an addition reactive carbon-carbon double bond bonded to a silicon atom other than the (E) component. The amount of the hydrogen atom bonded to a silicon atom in the composition is usually 0.5 to 2.0 moles, preferably 0.8 to 1.5 moles, relative to 1 mole of addition reactive carbon-carbon double bond bonded to a silicon atom in the composition. The proportion of the hydrogen atom bonded to a silicon atom in the (F) component relative to the hydrogen atom bonded to a silicon atom in the composition is usually 20 to 100% by mole, preferably 40 to 100% by mole. The amount of the addition reactive carbon-carbon double bond in the (E) component relative to the addition reactive carbon-carbon double bond bonded to a silicon atom in the composition is usually 20 to 100% by mole, preferably 40 to 100% by mole. When the amount of the (F) component to be blended satisfying such a condition is used for applications such a coating material, a hardened material having a sufficient hardness can be obtained.

When the composition does not contain a component having a hydrogen atom bonded to a silicon atom other than the (F) component and a component having an addition reactive carbon-carbon double bond bonded to a silicon atom other than the (E) component, the amount of the (F) component to be blended in the composition of the present invention is such an amount that the amount of the hydrogen atom bonded to a silicon atom in the (F) component is usually 0.5 to 2.0 moles, preferably 0.8 to 1.5 moles, relative to 1 mole of addition reactive carbon-carbon double bond bonded to a silicon atom in the (E) component.

(C) Component

The hydrosilylation reaction catalyst which is the (C) component of the present invention is the same as described in the above-described curable silicone resin composition.

The amount of the (C) component to be blended in the composition of the present invention is not particularly limited as long as it is effective as a catalyst. The (C) component is blended in an amount of usually 1 to 500 ppm, preferably about 2 to 100 ppm, relative to the total amount of the (E) and (F) components. When the amount falls within the above-described range, a time for a hardening reaction is proper. Therefore, there are not problems such as coloring of the hardened material.

It is preferable that the composition containing the (A) to (C) components of the present invention have an oxygen transmittance of 1,000 $cm^3/m^2/24$ h/atm or less after heat hardening. When the oxygen transmittance after heat hardening is 1,000 $cm^3/m^2/24$ h/atm or less, the suppression of transmission of gas such as sulfur oxide which is an effect of the present invention can be effectively achieved. When an LED apparatus in which a sealant is filled in a package in which a portion of the structure is plated with silver and is hardened is subjected to a sulfur exposure test, sulfur is not transmitted in a sealing resin, and the sulfuration of silver plating is not promoted. Therefore, black silver sulfide cannot be formed. The oxygen transmittance is preferably 500 $cm^3/m^2/24$ h/atm or less. In this case, the brightness of the LED apparatus is well kept. The lower limit of the oxygen transmittance is not particularly limited, and is usually 0 $cm^3/m^2/24$ h/atm or more. The process for measuring the oxygen transmittance will be described below.

Other Components

The composition of the present invention can contain any other components, in addition to the (A), (B), (C), (D), (E), and (F) components, phosphor particles, and nanoparticles. Illustrative examples thereof include the following components. The other components may be each used alone or in a combination of two or more kinds.

Aliphatic Unsaturated Group-Containing Compound Other than (A) or (E) Component

In the composition of the present invention, an aliphatic unsaturated group-containing compound that is subjected to an addition reaction with the (B) or (F) component may be blended. Such an aliphatic unsaturated group-containing compound is preferably a compound involved in the formation of the hardened material. Examples thereof include an organopolysiloxane having at least two aliphatic unsaturated groups per molecule. For example, the molecular structure thereof may be any of straight-chain, cyclic, branched-chain, and three-dimensional structures.

Illustrative examples of the aliphatic unsaturated group-containing compound include a monomer such as butadiene and diacrylate derived from polyfunctional alcohol; polyolefin such as copolymers of polyethylene, polypropylene, or styrene with another ethylenically unsaturated compound (e.g., acrylonitrile or butadiene); and oligomer or polymer derived from a functionally substituted organic compound such as an ester of acrylic acid, methacrylic acid, or maleic acid. The aliphatic unsaturated group-containing compound may be liquid or solid at room temperature.

Addition Reaction Controlling Agent

In order to secure the pot life of the composition of the present invention, an addition reaction controlling agent may be blended in the composition of the present invention. The addition reaction controlling agent is not particularly limited as long as it is a compound having an effect of suppressing hardening against a hydrosilylation catalyst of the (C) component, and a conventionally known addition substance can be used. Illustrative examples thereof include a phosphorous-containing compound such as triphenyl phosphine; a nitrogen-containing compound such as tributyl amine, tetramethyl ethylenediamine, and benzotriazole; a sulfur-containing compound; an acetylene-based compound such as acetylene alcohols (e.g., 1-ethynyl cyclohexanol, and 3,5-dimethyl-1-hexyn-3-ol); a compound having two or more alkenyl groups; a hydroperoxide compound; and a derivative of maleic acid.

The degree of the effect of suppressing hardening by an addition reaction controlling agent depends on the chemical structure of the addition reaction controlling agent. It is preferable that the amount of each of the addition reaction controlling agents to be added be adjusted to an optimum amount. When an optimum amount of addition reaction controlling agent is added, the composition has excellent long-time shelf stability at room temperature and heat curability.

Silane Coupling Agent

The composition of the present invention may contain an adhesion-imparting agent to improve adhesion. Examples of the adhesion-imparting agent include a silane coupling agent and a hydrolysis-condensation product thereof. As the silane coupling agent, the known silane coupling agent such as an epoxy group-containing silane coupling agent, a (meth)acrylic group-containing silane coupling agent, an isocyanate group-containing silane coupling agent, an isocyanurate group-containing silane coupling agent, an amino group-containing silane coupling agent, or a mercapto group-containing silane coupling agent is used. The amount of the silane coupling agent to be used is preferably 0.1 to 20 parts by mass, more preferably 0.3 to 10 parts by mass, relative to a total amount of the (A) and (B) components of 100 parts by mass or a total amount of the (E) and (F) components of 100 parts by mass.

Antioxidant

In the hardened material of the curable resin composition of the present invention, the addition reactive carbon-carbon double bond in the (E) component sometimes remains in a reacted state. Alternatively, the hardened material sometimes contains a carbon-carbon double bond produced by a ring-opening metathesis reaction of a 2-(bicyclo[2.2.1]hept-2-en-5-yl)ethyl group represented by the following structural formula (i),

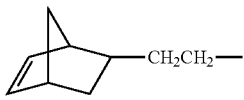

(i)

and/or a 2-(bicyclo[2.2.1]hept-2-en-6-yl)ethyl group represented by the following structural formula (ii),

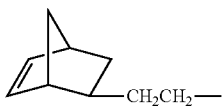

(ii)

The carbon-carbon double bond is oxidized by oxygen in air, to cause the coloring of the hardened material. In the present invention, in order to prevent the coloring previously, an antioxidant can be blended in the curable resin composition.

As the antioxidant, all the conventionally known antioxidants can be used. Examples thereof include 2,6-di-tert-butyl-4-methylphenol, 2,5-di-tert-amylhydroquinone, 2,5-di-tert-butylhydroquinone, 4,4'-butylidene-bis(3-methyl-6-tert-butylphenol), 2,2'-methylene-bis(4-methyl-6-tert-butylphenol), and 2,2'-methylene-bis(4-ethyl-6-tert-butylphenol). These antioxidants may be used alone or in a combination of two or more kinds.

When the antioxidant is used, the amount of the antioxidant to be blended is not particularly limited as long as it is effective as an antioxidant. The antioxidant is blended in an amount of usually 10 to 10,000 ppm, preferably about 100 to 1,000 ppm, relative to the total amount of the (E) and (F) components. When the amount falls within the above-described range, a function of preventing oxidation is sufficiently exerted, and the coloring, cloudiness, oxidative degradation, or the like does not occur. Therefore, a hardened material having excellent optical characteristics can be obtained.

Photostabilizer

In order to impart resistance to photodegradation by light energy of sunlight, fluorescent light, or the like, a photostabilizer may be used. As the photostabilizer, a hindered amine stabilizer of catching a radical produced by light oxidative degradation is suitable. The hindered amine stabilizer is used in combination with an antioxidant to improve an effect of preventing oxidation. Illustrative examples of the photostabilizer include bis(2,2,6,6-tetramethyl-4-piperidyl)sebacate and 4-benzoyl-2,2,6,6-tetramethylpiperidine.

In order to enhance the strength and suppress the precipitation of particles, an inorganic filler such as fumed silica and nano-alumina may be blended in the composition of the present invention, and if necessary, a dye, a pigment, an flame retarder, or the like, may be blended in the composition of the present invention.

Hardened Material

The curable resin composition of the present invention can be hardened under the known hardening condition by the known hardening process. Specifically, the composition can be hardened by heating usually at 80 to 200° C., preferably at 100 to 160° C. The heating time is about 0.5 minutes to about 5 hours, preferably about 1 minute to about 3 hours. When the precision is required for LED sealing, the hardening time is preferably elongated. The shape of the hardened material is not limited, and may be any of a gel hardened material, an elastomer hardened material, and a resin hardened material, for example.

Optical Semiconductor Apparatus

The hardened material of the curable resin composition of the present invention has excellent heat resistance, cold resistance, and electrical insulating property, similar to the ordinary hardened material of addition curable silicone composition. FIG. 1 shows one example of an optical semiconductor apparatus using the composition of the present invention. An optical semiconductor device 3 is wire bonded to a wire 2, and coated with a sealant 1 including the composition of the present invention. The coated sealant 1 is hardened under the known hardening condition by the known hardening process, specifically as described above. Thus, the optical semiconductor device 3 can be sealed.

Examples of the optical semiconductor device 3 sealed by the sealant 1 including the composition of the present invention include an LED, a semiconductor leaser, a photodiode, a phototransistor, a solar cell, and CCD.

EXAMPLES

Hereinafter, the present invention will be specifically described with reference to Examples and Comparative Examples, but the present invention is not limited to the following Examples. In the following example, symbols illustrating the average composition of silicone oil or silicone resin represent the following units. Further, the amount by mole of each silicone oil or each silicone resin represents the amount by mole of a vinyl group or a SiH group in each component.

$M^H$: $(CH_3)_2HSiO_{1/2}$
$M$: $(CH_3)_3SiO_{1/2}$
$M^{Vi}$: $(CH_2=CH)(CH_3)_2SiO_{1/2}$
$M^{Vi3}$: $(CH_2=CH)_3SiO_{1/2}$
$D^H$: $(CH_3)HSiO_{2/2}$
$D^\Phi$: $(C_6H_6)_2SiO_{2/2}$
$D$: $(CH_3)_2SiO_{2/2}$
$D^{Vi}$: $(CH_2=CH)(CH_3)SiO_{2/2}$
$T^\Phi$: $(C_6H_6)SiO_{3/2}$
$Q$: $SiO_{4/2}$

Blending Example 1

((A) component) 100 parts by mass of silicone oil represented by the average composition formula: $M^{Vi}_2D^\Phi_{2.8}$, ((B) component) 51.3 parts by mass of methylhydrogensiloxane represented by the average composition formula: $M^HD^H_2D^\Phi_2M^H$, ((C) component) 0.06 parts by mass of toluene solution containing a chloroplatinic acid/1,3-divinyltetramethyldisiloxane complex in a platinum atom content of 1% by mass, 0.05 parts by mass of ethynylcyclohexanol, and 3 parts by mass of γ-glycidoxypropyltrimethoxysilane were sufficiently stirred to prepare a silicone composition 1.

The viscosity of the composition 1 at room temperature was measured to be 700 mPa·s.

Synthesis Example 1

Preparation of (E) Component

A 500-mL four-necked flask equipped with a stirrer, a condenser, a dropping funnel, and a thermometer was charged with 60 g (0.5 moles) of vinylnorbornene (trade name: V0062, available from Tokyo Chemical Industry Co., Ltd.; isomeric mixtures of substantially equal molar amounts of 5-vinylbicyclo[2.2.1]hept-2-ene and 6-vinylbicyclo[2.2.1]hept-2-ene), and heated to 85° C. with an oil bath. To the mixture, 0.02 g of carbon powder supporting 5% by mass of platinum metal was added, and 38.8 g (0.2 moles) of 1,4-bis(dimethylsilyl)benzene was added dropwise over 25 minutes with stirring. After completion of dropwise addition, the mixture was stirred under heating at 90° C. for 24 hours, and cooled to room temperature. A platinum metal-supporting carbon was then removed through filtration, and excess vinylnorbornene was distilled off under reduced pressure, to obtain 79 g of reaction product (viscosity at 25° C.: 1,220 mm$^2$/s) as a colorless transparent oil.

The reaction product was analyzed by FT-IR, NMR, GPC, and the like. From the results, the reaction product was determined to be a mixture of (1) about 72% by mole of compound having a p-phenylene group: NBMe$_2$Si-p-C$_6$H$_4$—SiMe$_2$NB, (2) about 24% by mole of compound having two p-phenylene groups (one example of typical structural formula is shown below),

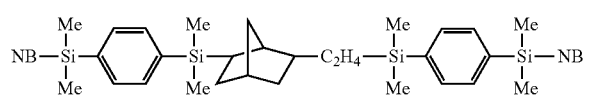

and (3) about 4% by mole of compound having three p-phenylene groups (one example of typical structural formula is shown below).

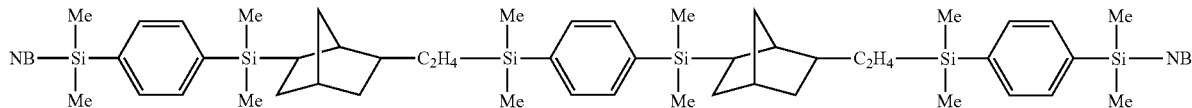

The content of the addition reactive carbon-carbon double bond relative to the entire mixture is 0.4 moles/100 g.

Synthesis Example 2

Preparation of (F) Component

A 500-mL four-necked flask equipped with a stirrer, a condenser, a dropping funnel, and a thermometer was charged with 80 g of toluene and 115.2 g (0.48 moles) of 1,3,5,7-tetramethylcyclotetrasiloxane, and heated to 117° C. with an oil bath. To the mixture, 0.05 g of carbon powder supporting 5% by mass of platinum metal was added, and 48 g (0.4 moles) of vinylnorbornene (trade name: V0062, available from Tokyo Chemical Industry Co., Ltd.; isomeric mixtures of substantially equal amounts by mole of 5-vinylbicyclo[2.2.1]hept-2-ene and 6-vinylbicyclo[2.2.1]hept-2-ene) was added dropwise over 16 minutes with stirring. After completion of dropwise addition, the mixture was stirred under heating at 125° C. for 16 hours, and cooled to room temperature. A platinum metal-supporting carbon was then removed through filtration, and toluene was distilled off under reduced pressure, to obtain 152 g of reaction product (viscosity at 25° C.: 2,500 mm$^2$/s) as a colorless transparent oil.

The reaction product was analyzed by FT-IR, NMR, GPC, and the like. From the results, the reaction product was determined to be a mixture of
(1) about 6% by mole of compound having a tetramethylcyclotetrasiloxane ring (one example of typical structural formula is shown below),

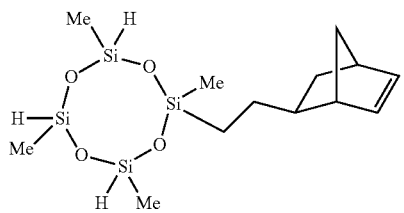 [SMILES: C[SiH]1O[SiH](C)O[Si](C)(CCC2CC3C=CC2C3)O[SiH](C)O1]

(2) about 25% by mole of compound having two tetramethylcyclotetrasiloxane rings (one example of typical structural formula is shown below),

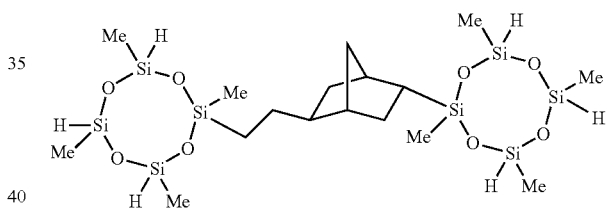

(3) about 16% by mole of compound having three tetramethylcyclotetrasiloxane rings (one example of typical structural formula is shown below),

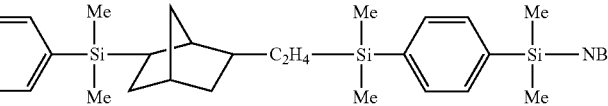

(4) about 11% by mole of compound having four tetramethylcyclotetrasiloxane rings (one example of typical structural formula is shown below),

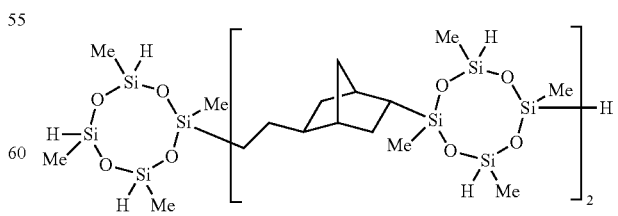

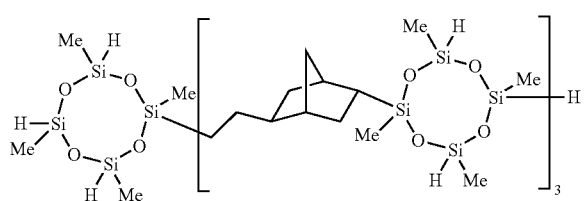

and (5) the rest of compound having 5 to 12 tetramethylcyclotetrasiloxane rings (one example of typical structural formula is shown below),

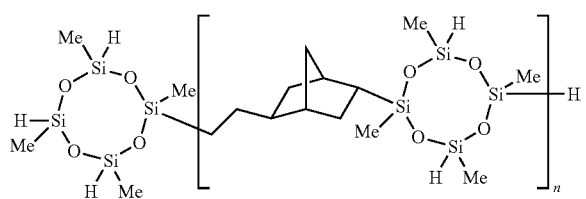

wherein, "n" represents an integer of 4 to 11.

The content of SiH relative to the entire mixture is 0.63 moles/100 g.

Blending Example 2

((E) component) 60 parts by mass of the reaction product obtained in Synthesis Example 1, ((F) component) 30 parts by mass of the reaction product obtained in Synthesis Example 2, ((C) component) 0.06 parts by mass of toluene solution containing a chloroplatinic acid/1,3-divinyltetramethyldisiloxane complex in a platinum atom content of 1% by mass, 0.05 parts by mass of ethynylcyclohexanol, and 3 parts by mass of γ-glycidoxypropyltrimethoxysilane were sufficiently stirred to prepare a silicone composition 2.

The viscosity of the composition 2 at room temperature was measured to be 300 mPa·s.

Blending Example 3

((A) component) 23 parts by mass of silicone oil represented by the average composition formula: $MD_{3.4}D^{Vi}_{6.5}D^{\Phi}_{8.6}M$ and 80 parts by mass of silicone oil represented by the average composition formula: $M^{Vi}_{2}D^{\Phi}_{2.8}$, ((B) component) 30 parts by mass of methylhydrogensiloxane represented by the average composition formula: $M^{H}D^{H}_{2}D^{\Phi}_{2}M^{H}$, ((C) component) 0.06 parts by mass of toluene solution containing a chloroplatinic acid/1,3-divinyltetramethyldisiloxane complex in a platinum atom content of 1% by mass, 0.05 parts by mass of ethynylcyclohexanol, and 3 parts by mass of γ-glycidoxypropyltrimethoxysilane were sufficiently stirred to prepare a silicone composition 3.

The viscosity of the composition 3 at room temperature was measured to be 3,000 mPa·s.

Blending Example 4

((A) component) 31 parts by mass of silicone oil represented by the average composition formula: $M^{Vi}_{2}D^{\Phi}_{2.8}$, ((B) component) 6.4 parts by mass of methylhydrogensiloxane represented by the average composition formula: $M^{H}D^{H}_{2}D^{\Phi}_{2}M^{H}$, ((C) component) 0.06 parts by mass of toluene solution containing a chloroplatinic acid/1,3-divinyltetramethyldisiloxane complex in a platinum atom content of 1% by mass, 0.05 parts by mass of ethynylcyclohexanol, and ((D) component) 59 parts by mass of branched-chain organopolysiloxane represented by $T^{\Phi}_{0.75}D^{Vi}_{0.25}$ (in a solid state at 25° C., content of vinyl group bonded to a silicon atom=20% by mole, content of phenyl group bonded to a silicon atom in the entire organic groups bonded to a silicon atom=50% by mole, and weight average molecular weight in terms of standard styrene=1,600), and 3 parts by mass of γ-glycidoxypropyltrimethoxysilane were sufficiently stirred to prepare a silicone composition 4.

The viscosity of the composition 4 at room temperature was measured to be 3,200 mPa·s.

Blending Example 5

((A) component): a viscous liquid at room temperature prepared by mixing 65 parts by mass of silicone resin that had a M unit, a $M^{Vi}$ unit, and a Q unit, and has a molar ratio of M unit to $M^{vi}$ unit of 6.25 and a total molar ratio of M unit and $M^{vi}$ unit to Q unit of 0.8 and 35 parts by mass of silicon oil represented by the average composition formula: $M^{Vi}_{3}D_{298}M^{Vi}_{3}$, ((B) component) 8 parts by mass of methylhydrogensiloxane represented by the average composition formula: $MD^{H}_{80}M$, ((C) component) 0.06 parts by mass of toluene solution containing a chloroplatinic acid/1,3-divinyltetramethyldisiloxane complex in a platinum atom content of 1% by mass, 0.05 parts by mass of ethynylcyclohexanol, and 3 parts by mass of γ-glycidoxypropyltrimethoxysilane were sufficiently stirred to prepare a silicone composition 5.

The viscosity of the composition 5 at room temperature was measured to be 15,000 mPa·s.

Example 1

1.5 parts by mass of nano-alumina (available from Nippon Aerosil Co., Ltd., trade name: AEROXIDE AluC805, average primary particle size: 13 nm) as nanoparticles was homogeneously dispersed in 100 parts by mass of the composition 1 in Blending Example 1 with a planetary centrifugal mixer with a vacuum deaeration mechanism (manufactured by THINKY CORPORATION, trade name: ARV-310). At this time, the particle size of nanoparticles secondarily aggregated was measured. Further, 8 parts by mass of YAG-based phosphor particles having a specific gravity of 5 g/cm³ was homogeneously dispersed with a planetary centrifugal mixer with a vacuum deaeration mechanism similarly, to prepare a composition (a).

Example 2

1 part by mass of nano-silica (available from Tokuyama Corporation., trade name: REOLOSIL DM30S, average primary particle size: 7 nm) as nanoparticles was homogeneously dispersed in 100 parts by mass of the composition 2 in Blending Example 2 with a planetary centrifugal mixer with a vacuum deaeration mechanism (manufactured by THINKY CORPORATION, trade name: ARV-310). At this time, the particle size of nanoparticles secondarily aggregated was measured. Further, 8 parts by mass of YAG-based phosphor particles having a specific gravity of 5 g/cm³ was homogeneously dispersed with a planetary centrifugal mixer with a vacuum deaeration mechanism similarly, to prepare a composition (b).

Example 3

7.5 parts by mass of nano-alumina (available from Nippon Aerosil Co., Ltd., trade name: AEROXIDE AluC805, average primary particle size: 13 nm) as nanoparticles was homogeneously dispersed in 100 parts by mass of the composition 3 in Blending Example 3 with a planetary centrifugal mixer with a vacuum deaeration mechanism (manufactured by THINKY CORPORATION, trade name: ARV-310). At this time, the particle size of nanoparticles secondarily aggregated was measured. Further, 8 parts by mass of YAG-based phosphor particles having a specific gravity of 5 g/cm$^3$ was homogeneously dispersed with a planetary centrifugal mixer with a vacuum deaeration mechanism similarly, to prepare a composition (c).

Example 4

1.5 parts by mass of nano-alumina (available from Nippon Aerosil Co., Ltd., trade name: AEROXIDE AluC805, average primary particle size: 13 nm) that had been slightly surface-treated with a (meth)acrylic group-containing silane coupling agent for a reduction in secondarily aggregation as nanoparticles was homogeneously dispersed in 100 parts by mass of the composition 1 in Blending Example 1 with a planetary centrifugal mixer with a vacuum deaeration mechanism (manufactured by THINKY CORPORATION, trade name: ARV-310). At this time, the particle size of nanoparticles secondarily aggregated was measured. Further, 8 parts by mass of YAG-based phosphor particles having a specific gravity of 5 g/cm$^3$ was homogeneously dispersed with a planetary centrifugal mixer with a vacuum deaeration mechanism similarly, to prepare a composition (d).

Example 5

1.5 parts by mass of nano-alumina (available from Nippon Aerosil Co., Ltd., trade name: AEROXIDE AluC805, average primary particle size: 13 nm) as nanoparticles was homogeneously dispersed in 100 parts by mass of the composition 4 in Blending Example 4 with a planetary centrifugal mixer with a vacuum deaeration mechanism (manufactured by THINKY CORPORATION, trade name: ARV-310). At this time, the particle size of nanoparticles secondarily aggregated was measured. Further, 8 parts by mass of YAG-based phosphor particles having a specific gravity of 5 g/cm$^3$ was homogeneously dispersed with a planetary centrifugal mixer with a vacuum deaeration mechanism similarly, to prepare a composition (e).

Comparative Example 1

The composition 1 in Blending Example 1 was used as it was without the addition of nanoparticles. 8 parts by mass of YAG-based phosphor particles having a specific gravity of 5 g/cm$^3$ was homogeneously dispersed with a planetary centrifugal mixer with a vacuum deaeration mechanism, to prepare a composition (f).

Comparative Example 2

1 part by mass of nano-silica (available from Tokuyama Corporation., trade name: REOLOSIL DM30S, average primary particle size: 7 nm) as nanoparticles was homogeneously dispersed in 100 parts by mass of the composition 5 in Blending Example 5 with a planetary centrifugal mixer with a vacuum deaeration mechanism (manufactured by THINKY CORPORATION, trade name: ARV-310). At this time, the particle size of nanoparticles secondarily aggregated was measured. Further, 8 parts by mass of YAG-based phosphor particles having a specific gravity of 5 g/cm$^3$ was homogeneously dispersed with a planetary centrifugal mixer with a vacuum deaeration mechanism similarly, to prepare a composition (g).

Comparative Example 3

1.5 parts by mass of nano-alumina (available from Nippon Aerosil Co., Ltd., trade name: AEROXIDE AluC805, average primary particle size: 13 nm) that had been sufficiently surface-treated with a (meth)acrylic group-containing silane coupling agent for prevention of secondarily aggregation as nanoparticles was homogeneously dispersed in 100 parts by mass of the composition 1 in Blending Example 1 with a planetary centrifugal mixer with a vacuum deaeration mechanism (manufactured by THINKY CORPORATION, trade name: ARV-310). At this time, the particle size of nanoparticles secondarily aggregated was measured. Further, 8 parts by mass of YAG-based phosphor particles having a specific gravity of 5 g/cm$^3$ was homogeneously dispersed with a planetary centrifugal mixer with a vacuum deaeration mechanism similarly, to prepare a composition (h).

Evaluations of the curable resin compositions (a) to (h) prepared in Examples and Comparative Examples were performed as follows.

Measurement of Particle Size Distribution of Nanoparticle

The particle size distribution of nanoparticles was measured with SALD-7100 manufactured by Shimadzu Corporation. As a measurement solution, an undiluted solution in which dilution was not particularly performed and nanoparticles were dispersed was used. A part of the measurement solution was sampled in a 50-μm indentation cell, a slide glass was place on the cell, and then a sample cell was prepared. This sample cell was set in a measurement portion, and was measured. The measurement was performed three times by the same procedure. The particle size distribution from 10 nm to 300 μm was measured in terms of volume Q3, and an average value for the average particle size (d50) was calculated.

Measurement of Total Luminous Flux (Lm) and Chromaticity Coordinate (x)

As an optical semiconductor device, a light-emitting semiconductor apparatus in which an LED chip 3 having a light-emitting layer made of InGaN and a main light-emitting peak of 450 nm was mounted on SMD5050 package (manufactured by I-CHIUN PRECISION INDUSTRY CO., resin posrtion PPA) and wire bonded to a wire 2, as shown in FIG. 1, was used.

1 g of phosphor particles was weighted and homogeneously mixed in 10 g of the curable resin composition prepared in each of Examples and Comparative Examples to prepare a sealing resin. 5 cc of the sealing resin was placed in a 10-cc syringe for dispensing immediately so that the precipitation of phosphor particles was not affected. A predetermined amount of the sealing resin was applied to the SMD5050 package without standby time. 5 cc of sealant 1 was applied continuously until the volume was 1 cc. These operations were a series of processes. The package in which the sealant was filled in the series of processes was thermally hardened at 150° C. for 4 hours to prepare an optical semiconductor package. Ten optical semiconductor apparatuses each obtained at the early stage and late stage of the application step were optionally sampled. The total luminous flux (Lm) and chromaticity coordinate (x) of ten optical semiconductor apparatuses were measured with a total luminous flux measurement system HM-9100 (manufactured by Otsuka Electronics Co., Ltd.). Average values thereof were calculated (force current IF=20 mA). The values of chromaticity coordinate (x) at the early stage and late stage of the application step were compared.

and the precipitation of phosphor particles is not confirmed. However, a nozzle is clogged in the dispensing process, and a good optical semiconductor apparatus cannot be fabricated.

TABLE 1

|  | Example 1 | Example 2 | Example 3 | Example 4 | Example 5 | Comparative Example 1 | Comparative Example 2 | Comparative Example 3 |
|---|---|---|---|---|---|---|---|---|
| Viscosity of resin composition | 700 | 300 | 3000 | 700 | 3200 | 700 | 15000 | 700 |
| Type of nanoparticle | Alumina | Silica | Alumina | Surface-treated alumina | Alumina | None | Silica | Surface-treated alumina |
| Primary particle size | 13 nm | 7 nm | 13 nm | 13 nm | 13 nm | Not added | 7 nm | 13 nm |
| Secondary particle size | 7.1 μm | 4.0 μm | 1.8 μm | 150 nm | 1.2 μm | Not added | 25 μm | 70 nm |
| State six hours after mixing and stirring of phosphor | Not precipitated | Not precipitated | Not precipitated | Not precipitated | Not precipitated | Precipitated | Not precipitated | Precipitated |
| Total luminous flux at early stage Lm | 8.41 | 8.40 | 8.40 | 8.40 | 8.40 | 8.46 | x | 8.43 |
| Total luminous flux at late stage Lm | 8.32 | 8.29 | 8.37 | 8.26 | 8.35 | 7.81 | x | 7.95 |
| Color coordinate (x) at early stage | 0.34 | 0.34 | 0.34 | 0.34 | 0.34 | 0.35 | x | 0.35 |
| Color coordinate (x) at late stage | 0.33 | 0.32 | 0.34 | 0.32 | 0.34 | 0.25 | x | 0.26 |
| Note |  |  |  |  |  |  | Nozzle clogging Not produced |  |

As shown in the above-described table, in the sealants in which phosphor particles are dispersed in the resin composition in which secondarily aggregated nanoparticles having a size of 100 nm or more and 20 μm or less are dispersed in Examples 1 to 5, the precipitation of phosphor particles is not confirmed even six hours after the deviation. Differences of the total luminous flux and the color coordinate at the early stage and late stage of the dispensing process are small. Further, color deviation is low through the processes, and a good optical semiconductor apparatus can be fabricated. In particular, even when the viscosity is low as in Example 2, differences of the total luminous flux and the color coordinate at the early stage and late stage of the dispensing process are small.

On the other hand, in Comparative Example 1 in which nanoparticles are not dispersed in the curable resin composition of Example 1, the precipitation of phosphor particles is confirmed. Differences of the total luminous flux and the color coordinate through the processes are large. Therefore, color deviation is high.

In Comparative Example 2 using a material in which the viscosity of the resin composition is high, the secondary particle size of dispersed nanoparticles is as large as 25 μm, In Comparative Example 3 in which sufficiently surface-treated nanoparticles are dispersed in the curable resin composition shown in Example 1, the secondarily aggregation of nanoparticles is suppressed, and therefore the secondary particle size is as small as 70 nm. Therefore, the precipitation of particles is confirmed after deviation of phosphor particles. Differences of the total luminous flux and the color coordinate through the processes are large. Therefore, color deviation is high.

Blending Example 6

((A) component) 100 parts by mass of silicone oil represented by the average composition formula: $M^H{}_2D^\Phi{}_{2.8}$, ((B) component) 51.3 parts by mass of methylhydrogensiloxane represented by the average composition formula: $M^HD^H{}_2D^\Phi{}_2M^H$, ((C) component) 0.06 parts by mass of toluene solution containing a chloroplatinic acid/1,3-divinyltetramethyldisiloxane complex in a platinum atom content of 1% by mass, 0.05 parts by mass of ethynylcyclohexanol, and 3 parts by mass of γ-glycidoxypropyltrimethoxysilane were sufficiently stirred to prepare a silicone composition 6.

The viscosity of the composition 6 at room temperature was measured to be 700 mPa·s.

The oxygen transmittance of the composition 6 after hardening was measured to be 210 cm$^3$/m$^2$/24 h/atm.

Blending Example 7

((A) component) 23 parts by mass of silicon oil represented by the average composition formula: $MD_{3.4}D^{Vi}_{6.5}D^{\Phi}_{8.6}M$ and 80 parts by mass of silicone oil represented by the average composition formula: $M^{Vi}_2 D^{\Phi}_{2.8}$, ((B) component) 30 parts by mass of methylhydrogensiloxane represented by the average composition formula: $M^H D^H_2 D^{\Phi}_2 M^H$, ((C) component) 0.06 parts by mass of toluene solution containing a chloroplatinic acid/1,3-divinyltetramethyldisiloxane complex in a platinum atom content of 1% by mass, 0.05 parts by mass of ethynylcyclohexanol, and 3 parts by mass of γ-glycidoxypropyltrimethoxysilane were sufficiently stirred to prepare a silicone composition 7.

The viscosity of the composition 7 at room temperature was measured to be 3,000 mPa·s.

The oxygen transmittance of the composition 7 after hardening was measured to be 400 cm$^3$/m$^2$/24 h/atm.

Blending Example 8

((A) component) 31 parts by mass of silicon oil represented by the average composition formula: $M^{Vi}_2 D^{\Phi}_{2.8}$, ((D) component) 59 parts by mass of branched-chain organopolysiloxane represented by $T^{\Phi}_{0.75} D^{Vi}_{0.25}$ (in a solid state at 25° C., content of vinyl group bonded to a silicon atom=20% by mole, content of phenyl group bonded to a silicon atom in the entire organic groups bonded to a silicon atom=50% by mole, and weight average molecular weight in terms of standard styrene=1,600), ((B) component) 6.4 parts by mass of methylhydrogensiloxane represented by the average composition formula: $M^H D^H_2 D^{\Phi}_2 M^H$, ((C) component) 0.06 parts by mass of toluene solution containing a chloroplatinic acid/1,3-divinyltetramethyldisiloxane complex in a platinum atom content of 1% by mass, 0.05 parts by mass of ethynylcyclohexanol, and 3 parts by mass of γ-glycidoxypropyltrimethoxysilane were sufficiently stirred to prepare a silicone composition 8.

The viscosity of the composition 8 at room temperature was measured to be 3,200 mPa·s.

The oxygen transmittance of the composition 8 after hardening was measured to be 250 cm$^3$/m$^2$/24 h/atm.

Example 6

2 parts by mass of nano-alumina (available from Nippon Aerosil Co., Ltd., trade name: AEROXIDE AluC805, average primary particle size: 13 nm) as nanoparticles was homogeneously dispersed in 100 parts by mass of the composition 6 in Blending Example 6 with a planetary centrifugal mixer with a vacuum deaeration mechanism (manufactured by THINKY CORPORATION, trade name: ARV-310). At this time, the particle size of nanoparticles secondarily aggregated was measured. Further, 5 parts by mass of silicone resin powder (available from Shin-Etsu Chemical Co., Ltd., trade name: X-52-1621, average particle size: 5 μm) was homogeneously mixed with a planetary centrifugal mixer with a vacuum deaeration mechanism similarly. Further, 8 parts by mass of YAG-based phosphor particles having a specific gravity of 5 g/cm$^3$ was homogeneously dispersed with a planetary centrifugal mixer with a vacuum deaeration mechanism similarly, to prepare a curable resin composition (a').

Example 7

2 part by mass of nano-silica (available from Tokuyama Corporation., trade name: REOLOSIL DM30S, average primary particle size: 7 nm) as nanoparticles was homogeneously dispersed in 100 parts by mass of the composition 7 in Blending Example 7 with a planetary centrifugal mixer with a vacuum deaeration mechanism (manufactured by THINKY CORPORATION, trade name: ARV-310). At this time, the particle size of nanoparticles secondarily aggregated was measured. Further, 5 parts by mass of silicone combined powder (available from Shin-Etsu Chemical Co., Ltd., trade name: KMP-600, average particle size: 5 μm) was homogeneously mixed with a planetary centrifugal mixer with a vacuum deaeration mechanism similarly. Further, 8 parts by mass of YAG-based phosphor particles having a specific gravity of 5 g/cm$^3$ was homogeneously dispersed with a planetary centrifugal mixer with a vacuum deaeration mechanism similarly, to prepare a curable resin composition (b').

Example 8

2 parts by mass of nano-alumina (available from Nippon Aerosil Co., Ltd., trade name: AEROXIDE AluC805, average primary particle size: 13 nm) as nanoparticles was homogeneously dispersed in 100 parts by mass of the composition 8 in Blending Example 8 with a planetary centrifugal mixer with a vacuum deaeration mechanism (manufactured by THINKY CORPORATION, trade name: ARV-310). At this time, the particle size of nanoparticles secondarily aggregated was measured. Further, 5 parts by mass of silicone resin powder (available from Shin-Etsu Chemical Co., Ltd., trade name: X-52-1621, average particle size: 5 μm) was homogeneously mixed with a planetary centrifugal mixer with a vacuum deaeration mechanism similarly. Further, 8 parts by mass of YAG-based phosphor particles having a specific gravity of 5 g/cm$^3$ was homogeneously dispersed with a planetary centrifugal mixer with a vacuum deaeration mechanism similarly, to prepare a curable resin composition (c').

Example 9

2 parts by mass of nano-alumina (available from Nippon Aerosil Co., Ltd., trade name: AEROXIDE AluC805, average primary particle size: 13 nm) that had been slightly surface-treated with a (meth)acrylic group-containing silane coupling agent for a reduction in secondarily aggregation as nanoparticles was homogeneously dispersed in 100 parts by mass of the composition 6 in Blending Example 6 with a planetary centrifugal mixer with a vacuum deaeration mechanism (manufactured by THINKY CORPORATION, trade name: ARV-310). At this time, the particle size of nanoparticles secondarily aggregated was measured. Further, 5 parts by mass of silicone resin powder (available from Shin-Etsu Chemical Co., Ltd., trade name: X-52-1621, average particle size: 5 μm) was homogeneously mixed with a planetary centrifugal mixer with a vacuum deaeration mechanism similarly. Further, 8 parts by mass of YAG-based phosphor particles having a specific gravity of 5 g/cm$^3$ was homogeneously dispersed with a planetary centrifugal mixer with a vacuum deaeration mechanism similarly, to prepare a curable resin composition (d').

Comparative Example 4

A composition (e') was prepared by the same operation as in Example 6 except that nanoparticles and a silicone powder were not added.

Comparative Example 5

A composition (f') was prepared by the same operation as in Example 7 except that nanoparticles and a silicone powder were not added.

Comparative Example 6

A composition (g') was prepared by the same operation as in Example 8 except that nanoparticles and a silicone powder were not added.

Comparative Example 7

A composition (h') was prepared by the same operation as in Example 6 except that nanoparticles were not added.

Comparative Example 8

A composition (i') was prepared by the same operation as in Example 6 except that a silicone powder was not added.

Comparative Example 9

A composition (j') was prepared in the same manner as in Example 6 except that 2 parts by mass of nano-alumina (available from Nippon Aerosil Co., Ltd., trade name: AEROXIDE AluC805, average primary particle size: 13 nm) that had been sufficiently surface-treated with a (meth)acrylic group-containing silane coupling agent for prevention of secondarily aggregation as nanoparticles was used.

Comparative Example 10

A composition (k') was prepared by the same operation as in Example 6 except that crude particles which was a trade name: X-52-854 available from Shin-Etsu Chemical Co., Ltd., was cut into an average particle size of 0.4 μm and 5 parts by mass of the particles was used as a silicone resin powder.

Evaluations of the curable resin compositions (a') to (k') prepared in Examples and Comparative Examples were be performed as follows.

Confirmation of Dispersion State of Phosphor Particles

The deviation state was visually confirmed 6 hours after mixing the phosphor under stirring.

Measurement of Particle Size Distribution of Nanoparticle

The particle size distribution of nanoparticles was measured with SALD-7100 manufactured by Shimadzu Corporation. As a measurement solution, an undiluted solution in which dilution was not particularly performed and nanoparticles were dispersed was used. A part of the measurement solution was sampled in a 50-μm indentation cell, a slide glass was placed on the cell, and then a sample cell was prepared. This sample cell was set in a measurement portion, and was measured. The measurement was performed three times in the same procedure. The particle size distribution from 10 nm to 300 μm was measured in terms of volume Q3, and an average value for the average particle size (d50) was calculated.

Measurement of Oxygen Transmittance

The oxygen transmittance was measured in accordance with JIS-K7126-2 (measurement temperature: 23° C., sample thickness: 1 mm).

Measurement of Chromaticity Coordinate (x)

As an optical semiconductor device, a light-emitting semiconductor apparatus in which an LED chip 3 having a light-emitting layer made of InGaN and a main light-emitting peak of 450 nm was mounted on SMD5050 package (manufactured by I-CHIUN PRECISION INDUSTRY CO., resin posrtion PPA) and wire bonded to a wire 2, as shown in FIG. 1, was used.

1 g of phosphor particles was weighted and homogeneously mixed in 10 g of the curable resin composition prepared in each of Examples and Comparative Examples to prepare a sealing resin. 5 cc of the sealing resin was placed in a 10-cc syringe for dispensing immediately so that the precipitation of phosphor particles was not affected. A predetermined amount of the sealing resin was applied to the SMD5050 package without standby time. 5 cc of sealant 1 was applied continuously until the volume was 1 cc. These operations were a series of processes. The package in which had been charged with the sealant was hardened by heating at 150° C. for 4 hours to prepare an optical semiconductor package. Ten optical semiconductor apparatuses each obtained at the early stage and late stage of the application process were optionally sampled. The chromaticity coordinate (x) of ten optical semiconductor apparatuses were measured with a total luminous flux measurement system HM-9100 (manufactured by Otsuka Electronics Co., Ltd.). Average values thereof were calculated (force current IF=20 mA). The values of chromaticity coordinate (x) at the early stage and late stage of the application step were compared.

Measurement of Total Luminous Flux (Lm)

As an optical semiconductor device, a light-emitting semiconductor apparatus in which an LED chip having a light-emitting layer made of InGaN and a main light-emitting peak of 450 nm was mounted on SMD5050 package (manufactured by I-CHIUN PRECISION INDUSTRY CO., resin posrtion PPA) and wire bonded, as shown in FIG. 1, was used.

The curable resin composition prepared in each of Examples and Comparative Examples in which a phosphor was not added so that the precipitation of phosphor was not affected was filled in the package, and hardened by heating at 150° C. for 4 hours in the same manner as described above. Thus, each optical semiconductor package was prepared. Ten optical semiconductor apparatuses each obtained through the process were optionally sampled. The total luminous flux (Lm) was measured with a total luminous flux measurement system HM-9100 (manufactured by Otsuka Electronics Co., Ltd.). Average values thereof were calculated (force current IF=20 mA). In order to see whether the light extraction efficiency is good or bad due to addition of each silicone powder, the values of total luminous flux are compared (the following expression).

(light extraction efficiency)={(total luminous flux after addition of powder)/(total luminous flux before addition of powder)}×100−100(%)

The ten light-emitting apparatuses measured above were allowed to stand in a dryer at 180° C. for 24 hours. Similarly, the total luminous flux (Lm) was measured with a total luminous flux measurement system. Average values thereof were calculated (force current IF=20 mA). The values were compared, and the total luminous flux residual rate (%) after a heat resistance test was calculated (the following expression).

(total luminous flux residual rate after heat resistance test)={(total luminous flux after heating at 180° C. for 24 hours)/(total luminous flux at early stage)}×100(%)

The calculated total luminous flux residual rates after the heat resistance test were compared to see whether the improvement of heat resistance was good or bad due to addition of each silicone powder.

(Ratio of total luminous flux residual rates after heat resistance test)={(total luminous flux rate after heat resistance test of sample after addition of powder)/(total luminous flux rate after heat resistance test of sample before addition of powder)}×100−100(%)

In both the light extraction efficiency and the total luminous flux residual rate obtained from the expressions, a positive value exhibits that it is lighter than the standard, and a negative value exhibits that it is darker than the standard.

Temperature Cycling Test (TCT) Condition
Temperature: −40° C. to 125° C.
The number of cycles: 1,000

Ten produced light-emitting semiconductor apparatuses were placed in a temperature cycling test apparatus. After 1,000 cycles, the number of LED packages not lighted was counted and judged as NG. When the value in Table 2 is zero, the package can be lighted and has excellent reliability. When it is 10, all the packages are not lighted, and have poor reliability.

Sulfuration Test of Package 0.2 g of sulfur powder and the LED package sealed by each compression were sealed in a 100-mL transparent glass bottle. After the sealing, the bottle was placed in a dryer at 70° C., and taken out after 24 hours. The discoloration of silver plating portion of the package was observed with a microscope. The package discolored into black is judged to be discoloration (NG).

TABLE 2

| | Example | | | | Comparative Example | | | | | | |
|---|---|---|---|---|---|---|---|---|---|---|---|
| | 6 | 7 | 8 | 9 | 4 | 5 | 6 | 7 | 8 | 9 | 10 |
| Viscosity of resin composition mPa·s | 700 | 3,000 | 3,200 | 700 | 700 | 3,000 | 3,200 | 700 | 700 | 700 | 700 |
| Primary particle size of nanoparticles | 13 nm | 7 nm | 13 nm | 13 nm | Not added | Not added | Not added | Not added | 13 nm | 13 nm | 13 nm |
| Secondary particle size of nanoparticles | 7.1 μm | 4.0 μm | 4.8 μm | 150 nm | Not added | Not added | Not added | Not added | 7.1 μm | 70 nm | 7.1 μm |
| Average particle size of silicone powder (μm) | 5 | 5 | 5 | 5 | Not added | Not added | Not added | 5 | Not added | 5 | 0.4 |
| State 6 hours after mixing phosphor under stirring | Good | Good | Good | Good | Precipitated | Precipitated | Precipitated | Preciptated | Good | Preciptated | Good |
| Color coordinate (x) at early stage | 0.34 | 0.34 | 0.34 | 0.34 | 0.37 | 0.36 | 0.36 | 0.35 | 0.34 | 0.35 | 0.34 |
| Color coordinate (x) at late stage | 0.31 | 0.32 | 0.32 | 0.31 | 0.25 | 0.27 | 0.28 | 0.28 | 0.31 | 0.28 | 0.32 |
| Number of LED not lighted after temperature cycle | 0 | 0 | 0 | 0 | 10 | 10 | 10 | 0 | 10 | 0 | 0 |
| Light extraction efficiency (%) | 6.3 | 5.4 | 7.7 | 4.6 | ±0 (Standard) | ±0 (Standard) | ±0 (Standard) | 6.6 | −1.2 | 4.7 | −28 |
| Total luminous flux residual rate after heat resistance test (%) | 3.1 | 2.8 | 2.1 | 2.8 | ±0 (Standard) | ±0 (Standard) | ±0 (Standard) | 5.0 | −0.4 | 2.4 | −8.0 |
| Sulfuration resistance test | OK | OK | OK | OK | OK | OK | OK | OK | OK | OK | OK |
| Note | | | | | TCT NG | TCT NG | TCT NG | Color coordinate NG | TCT NG | Color coordinate NG | Heat Resistance NG |

As shown in the above-described table, in the resin compositions (Examples 6 to 9) in which phosphor particles are dispersed in the resin composition in which secondarily aggregated nanoparticles having a size of 100 nm or more and 20 μm or less and a silicone powder are dispersed, the precipitation of the phosphor particles is not confirmed even six hours after the deviation. Differences of the total luminous flux and the color coordinate at the early stage and late stage of the dispensing process are small. Further, color deviation is low through the processes, and a good optical semiconductor apparatus can be fabricated.

On the other hand, in Comparative Examples 4 to 6 using a resin composition which is the same as in Examples 6 to 8 except that nanoparticles and a silicone powder are not used, the light extraction efficiency is lower as compared with Examples, and the precipitation of phosphor is confirmed. A difference of the color coordinate through the processes is large, and the color deviation is high. Further, the resistance to thermal shock is lower.

In Comparative Example 7 using a composition which is the same as in Example 6 except that nanoparticles are not used, the resistance to thermal shock is excellent, but the precipitation of phosphor is confirmed. Further, a difference of color coordinate is large and the color deviation is high through the processes. Therefore, a good optical semiconductor apparatus cannot be fabricated.

In Comparative Example 8 using a composition which is the same as in Example 6 except that a silicone powder is not used, a difference of color coordinate at the early stage and late stage of dispensing process is low, but the resistance to thermal shock is lower. Therefore, a good optical semiconductor apparatus cannot be produced.

In Comparative Example 9 which is the same as in Example 6 except that sufficiently surface-treated nanoparticles are added instead of the nanoparticles, the secondarily aggregation of nanoparticles is suppressed, and therefore the secondary particle size is as small as 70 nm. Therefore, the precipitation of phosphor is confirmed after mixing of the phosphor under stirring. A difference of the color coordinate through the processes is large, and the color deviation is high.

In Comparative Example 10 which is the same as in Example 6 except that a silicone powder having a small average particle size is added instead of the silicon powder of the composition of Example 6, the resistance to thermal shock is excellent. However, the light extraction efficiency after addition of silicone powder and the total luminous flux residual rate after the heat resistance test are low.

The present invention is not restricted to the embodiments shown above. The embodiments shown above are merely examples so that any embodiments composed of substantially the same technical concept as disclosed in the claims of the present invention and expressing a similar effect are included in the technical scope of the present invention.

What is claimed is:

1. A curable resin composition to which at least phosphor particles and nanoparticles having a primary particle size of 1 nm or more and less than 100 nm are added, wherein the nanoparticles are dispersed in the form of secondarily aggregated particles having an average particle size of 100 nm or more and 20 μm or less in terms of volume Q3.

2. The curable resin composition according to claim 1, wherein a silicone powder having an average particle size of 0.5 to 100 μm are dispersed in the curable resin composition.

3. The curable resin composition according to claim 1, comprising at least one of a silicone resin, a modified silicone resin, an epoxy resin, and a modified epoxy resin, wherein the viscosity at room temperature of the curable resin composition is 100 mPa·s or more and 10,000 mPa·s or less.

4. The curable resin composition according to claim 2, comprising at least one of a silicone resin, a modified silicone resin, an epoxy resin, and a modified epoxy resin, wherein the viscosity at room temperature of the curable resin composition is 100 mPa·s or more and 10,000 mPa·s or less.

5. The curable resin composition according to claim 1, wherein the curable resin composition contains a silicone resin or a modified silicone resin.

6. The curable resin composition according to claim 2, wherein the curable resin composition contains a silicone resin or a modified silicone resin.

7. The curable resin composition according to claim 3, wherein the curable resin composition contains a silicone resin or a modified silicone resin.

8. The curable resin composition according to claim 4, wherein the curable resin composition contains a silicone resin or a modified silicone resin.

9. The curable resin composition according to claim 1, wherein the curable resin composition is a curable silicone composition containing (A) a compound represented by the following general formula (1),

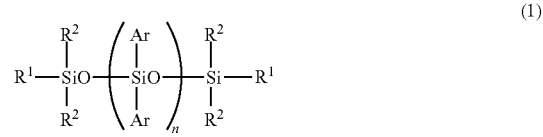

wherein, $R^1$ represents an aliphatic unsaturated group, $R^2$ represents the same or different unsubstituted or substituted monovalent hydrocarbon group, Ar represents an aryl group optionally having the same or different heteroatom, and "n" represents an integer of 1 or more, (B) a compound represented by the following average composition formula (2) and having at least two SiH groups per molecule,

wherein, $R^3$ represents the same or different unsubstituted or substituted monovalent hydrocarbon group bonded to a silicon atom, provided that an aliphatic unsaturated group is not included, and "a" and "b" represent a positive number satisfying $0.7 \leq a \leq 2.1$, $0.001 \leq b \leq 1.0$, and $0.8 \leq a+b \leq 3.0$, and (C) a hydrosilylation catalyst containing a platinum group metal.

10. The curable resin composition according to claim 9, wherein the (A) component in the curable silicone composition contains a compound having a structure represented by the following general formula (1') and at least two aliphatic unsaturated groups per molecule,

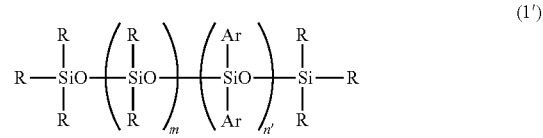

wherein, R represents the same or different unsubstituted or substituted monovalent hydrocarbon group, Ar represents an aryl group optionally having the same or different heteroatom, "m" represents an integer of 0 or 1 or more, and "n'" represents an integer of 1 or more.

11. The curable resin composition according to claim 9, wherein in the (A) component represented by the general formula (1) or (1'), Ar represents a phenyl group and "n" or "n'" represents an integer of 1 to 100.

12. The curable resin composition according to claim 9, wherein the curable resin composition contains the following (D) component,
(D) a compound having a structure represented by the following average composition formula (3),

  (3)

wherein, $R^0$ represents any of the same or different substituted or unsubstituted monovalent hydrocarbon or an alkoxy group and a hydroxyl group, provided that a phenyl group is not included, 0.1 to 80% by mole of all $R^0$ represents an alkenyl group, and "c" and "d" represent a positive number satisfying $1 \leq c+d \leq 2$ and $0.20 \leq d/(c+d) \leq 0.95$.

13. The curable resin composition according to claim 9, wherein the oxygen transmittance of the hardened material obtained by hardening the curable silicone resin composition be 1,000 cm$^3$/m$^2$/24 h/atm or less.

14. The curable resin composition according to claim 1, wherein the curable resin composition is a curable modified silicone composition containing:
(E) a polycyclic hydrocarbon group-containing organosilicon compound which is a product of addition reaction of (X) an organosilicon compound having two hydrogen atoms bonded to a silicon atom per molecule, and (Y) a polycyclic hydrocarbon compound having two hydrosilylation reactive carbon-carbon double bonds per molecule and has two carbon-carbon double bonds bonded to silicon atoms per molecule, (F) any of a siloxane compound having three or more hydrogen atoms bonded to a silicon atom per molecule, an organic modified siloxane compound, and a combination of both, and (C) a hydrosilylation catalyst containing a platinum group metal.

15. The curable resin composition according to claim 14, wherein the (X) component in the (E) component is an organosilicon compound represented by the following general formula (4),

  (4)

wherein, A represents a divalent group selected from the group consisting of a group represented by the following general formula (5),

  (5)

wherein R' independently represents an unsubstituted or substituted monovalent hydrocarbon group having 1 to 12 carbon atoms or an alkoxy group having 1 to 6 carbon atoms, and "r'" represents an integer of 0 to 100, and a group represented by the following structural formula (6),

  (6)

wherein R" independently represents an unsubstituted or substituted monovalent hydrocarbon group having 1 to 12 carbon atoms or an alkoxy group having 1 to 6 carbon atoms.

16. The curable resin composition according to claim 14, wherein the polycyclic hydrocarbon compound of the (Y) component is 5-vinyl bicyclo[2.2.1]hept-2-ene, 6-vinyl bicycl[2.2.1]hept-2-ene, or a combination of both.

17. The curable resin composition according to claim 14, wherein the (F) component is 1,3,5,7-tetramethyl cyclotetrasiloxane.

18. The curable resin composition according to claim 14, wherein the (F) component is a product of addition reaction of 5-vinyl bicyclo[2.2.1]hept-2-ene, 6-vinyl bicycl[2.2.1]hept-2-ene, or a combination of both with 1,3,5,7-tetramethyl cyclotetrasiloxane.

19. A hardened material obtained by hardening the curable resin composition according to claim 1.

20. An optical semiconductor apparatus using the hardened material according to claim 19.

* * * * *